United States Patent [19]
Hashizume

[11] Patent Number: 5,841,791
[45] Date of Patent: Nov. 24, 1998

[54] BYPASS SCAN PATH AND INTEGRATED CIRCUIT DEVICE USING THE SAME

[75] Inventor: Takeshi Hashizume, Hyogo-ken, Japan

[73] Assignee: Mitsubishi Denki Kabushiki Kaisha, Tokyo, Japan

[21] Appl. No.: 862,600

[22] Filed: May 23, 1997

Related U.S. Application Data

[63] Continuation of Ser. No. 714,033, Sep. 11, 1996, abandoned, which is a continuation of Ser. No. 851,393, Mar. 13, 1992, abandoned.

[30] Foreign Application Priority Data

Mar. 20, 1991 [JP] Japan ..................................... 3-055255
Sep. 27, 1991 [JP] Japan ..................................... 3-249554

[51] Int. Cl.$^6$ ..................................................... G06F 13/00
[52] U.S. Cl. ......................... 371/22.3; 371/22.6; 371/22.5
[58] Field of Search ................................. 371/22.3, 22.6, 371/22.5

[56] References Cited

U.S. PATENT DOCUMENTS 4,872,169 10/1989 Whetsel, Jr. ................................ 371/15
5,150,044 9/1992 Hashizume et al. .................... 371/22.3
5,260,949 11/1993 Hashizume et al. .................... 371/22.3

OTHER PUBLICATIONS

Riessen et al., An Architecture w/ Boundary Scan, Feb. 1990, pp. 9–17.
"Designing and Implementing an Architecture with Boundary Scan", R.P. Van Riessen et al., IEEE Design & Test of Computers, Feb. 1990, pp. 9–19.
"Implementing Macro Test in Silicon Compiler Design", Frans Beenker et al., IEEE Design & Test of Computers, Apr. 1990, pp. 41–51.
"An Enhancement of Cell–Based Test Design Method for Boundary Scan Architecture", Takeshi Hashizume et al. Nov. 21, 1990, pp. 63–69.
"IEEE Standard Test Access Port and Boundary–Scan Architecture", May 21, 1990, Chapter 4 and 6.

*Primary Examiner*—Robert W. Beausoliel, Jr.
*Assistant Examiner*—Norman M. Wright
*Attorney, Agent, or Firm*—McDermott, Will & Emery

[57] ABSTRACT

A plurality of bypass scan paths are provided in series between an SI terminal and an SO terminal to constitute a scan path for propagating serial data. In each of bypass scan paths, a selection data propagation holding register and a mode data propagation holding register are not connected in series with a scan register as in a conventional scan path, but arranged on a bypass path formed by a bypass line. Therefore, the selection data propagation holding register and the mode propagation holding register carry out none of unnecessary shifting operation in a bypass scan path selecting a register path at the time of propagation of test data and test result data. As a result, a time period can be reduced for shifting in test data and shifting out test result data.

14 Claims, 17 Drawing Sheets

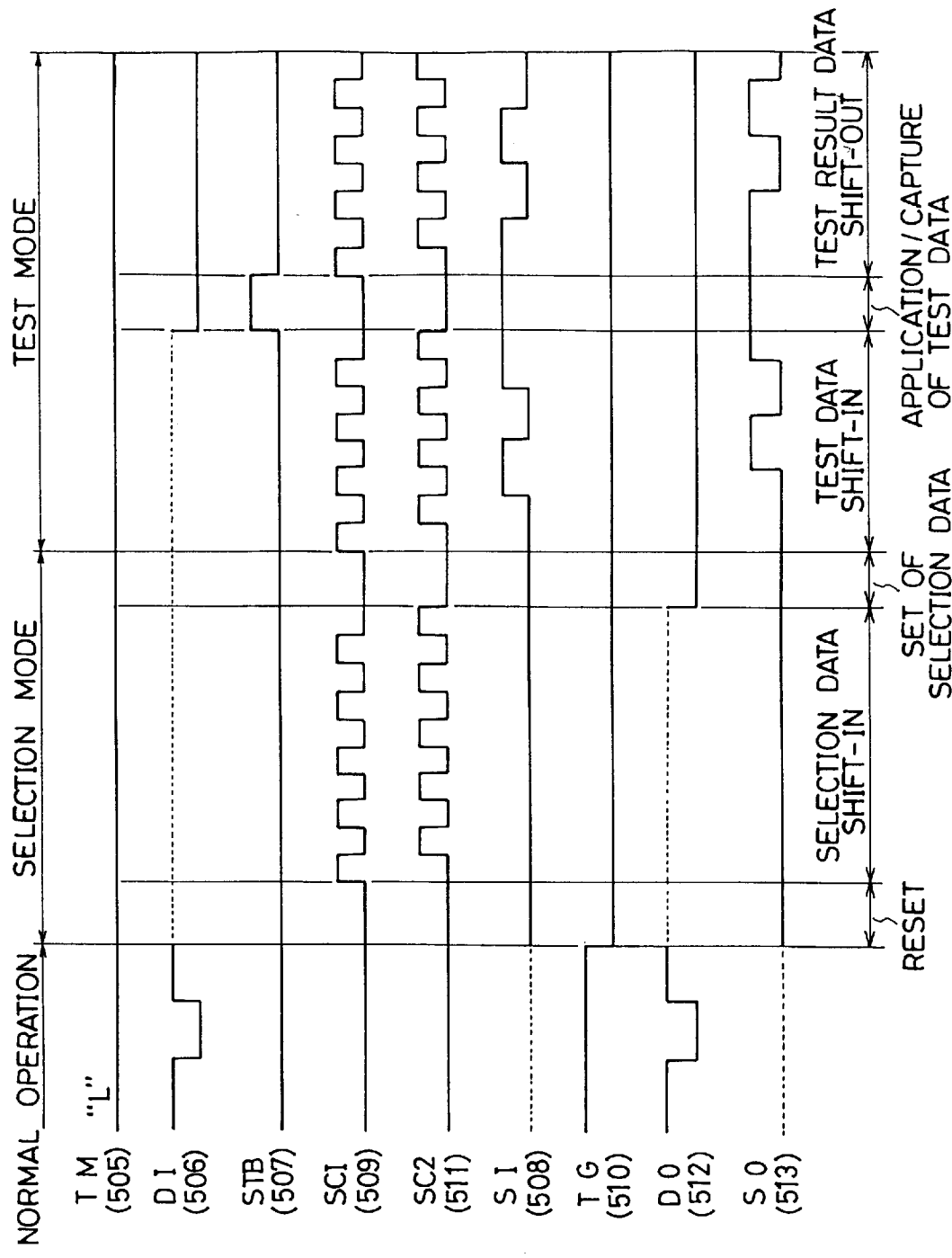

BYPASS SCAN PATH AND INTEGRATED CIRCUIT DEVICE USING THE SAME

This application is a continuation of application Ser. No. 08/714,033 filed Sep. 11, 1996, now abandoned which is a continuation of application Ser. No. 07/851,393, filed Mar. 13, 1992, now abandoned.

BACKGROUND OF THE INVENTION

1. Field of the Invention

The present invention relates generally to bypass scan paths, and more particularly, to bypass scan paths for serially propagating various data (test data, for example) in an integrated circuit device.

2. Description of the Background Art

For a test of the inner part of an integrated circuit device, in particular, of a device internally having complicated function logic, it is extremely difficult to check the internal state by using a primary input/output terminal only. Such difficulty is represented as two words "observability" and "controllability".

Controllability indicates the degree of difficulty in controlling internal signals of the circuit. Observability indicates the degree of difficulty in observing the internal state of the circuit.

For finding whether some part of the circuit is defective, for example, input signals applied to the part should be freely controlled. In addition, the outputs obtained as a result of a predetermined input should be accurately observed. It is therefore impossible to determine whether the circuit has a defect or not if one of the observability and the controllability lacks.

An integrated circuit device having complicated function logic, however, includes numerous gates provided between a portion to be tested and a primary input-output terminal. It is therefore extremely difficult to obtain accurate observability and controllability. In addition, with the advance of semiconductor techniques, integrated circuit devices have been made larger in scale and complicated, resulting in an extreme difficulty in testing an inner part of the circuit.

For the above-described reasons, a so-called test facilitating architecture assumes importance. A test is executed in a plurality of stages for creating test data, operating a circuit to be tested by the test data, outputting a test result and verifying the result. An increase in the scale of a circuit is followed by an increase in a test time period. It is therefore important to finish the test in a time period as short as possible.

Such a scan architecture as described in the following is often used for facilitating a test. In the scan architecture, shift register latches (hereinafter referred to as SRL) are provided at observation points (where output is to be observed) and control points (where input is to be set) internally arranged in an integrated circuit. The plurality of SRL are connected in series to form a scan path capable of propagating data.

External test data is applied to the scan path to be propagated in series therethrough, resulting in setting desired test data in SRL at a control point. Stored data of each SRL is applied to a test circuit to be tested. The output (test result data) of the circuit to be tested is applied to SRL at each observation point and stored therein. The test result data stored in the SRL is again serially propagated through the scan path and output as an external serial signal from an output terminal. Provision of such a scan path enables observability and controllability to be obtained at an internal portion of the integrated circuit device.

The scan architecture requires data to be used in time sequence. As a result, a bit length of the scan path is increased due to the increase in scale of an integrated circuit device, which is followed by an increase of a data propagation time, thereby increasing a test time period. Reduction of a test time period and the number of test pins is to be achieved for testing an integrated circuit.

In a conventional integrated circuit, one scan path is divided into a plurality of parts each including a bypass line for bypassing the input and the output of the scan path, thereby selectively propagating input data to any of SRL and the bypass lines. As a result, only a required part of the scan path operates to shift the data, making a data propagation time period shorter to reduce a test time period.

FIG. 12 is a block diagram showing one example of a conventional integrated circuit device of scan architecture. In the drawing, an integrated circuit device 1 includes three, for example, function modules 11–13. Each of function modules 11–13 is structured by a plurality of logic gates to form a predetermined function unit. Testing of integrated circuit device 1 is executed for each function module.

In normal operation, the respective function modules 11–13 receive system data input through system data input terminals 20a–20k. The system data processed by each of function modules 11–13 is externally output through system data output terminals 21a–21j.

For a test of each of function modules 11–13, one scan path 4 is provided between an SI terminal (shift-in terminal) 31 and an SO terminal (shift-out terminal) 32. Scan path 4 includes a plurality of bypass scan paths 4a–4d. Each of bypass scan paths 4a–4d includes one or a plurality of SRL connected in series, each SRL being connected to a control point and/or an observation point of the corresponding function module. Each of bypass scan paths 4a–4d includes a bypass line. Depending on the internal structure of integrated circuit device 1, it is selectively determined how to divide one scan path into bypass scan paths (strictly written, it is possible for one scan path to include only one bypass scan path) and which bit length is selected for each bypass scan path (determined by the number of SRL included in the bypass scan path).

The operation of the respective bypass scan paths 4a–4d is controlled by various control signals input through a control signal input terminal 33.

Scan path 4 sequentially shifts test data serially input from SI terminal 31 to hold the same at a predetermined SRL. The test data held at the SRL is applied to a control point of a function module selected to be tested. Scan path 4 also captures test result data output from the function module to hold the same at a predetermined SRL. The test result data held at the SRL are sequentially shifted and externally output through SO terminal 32. External check of the test result data output from SO terminal 32 results in determination as to whether the function module operates normally or not.

FIG. 13 is a block diagram showing only the scan path 4 of integrated circuit device of FIG. 12. Such a scan path is disclosed in, for example, IEEE Design and Test February 1990 pp. 9–19 "DESIGNING AND IMPLEMENTING AN ARCHITECTURE WITH BOUNDARY SCAN". In the drawing, each of bypass scan paths 4a–4d includes a scan register 41, a bypass line 42, a multiplexer (hereinafter referred to as MUX) 43, a selection data holding register (PS register) 44 and a mode data holding register (MS register) 45.

FIG. 14 is a block diagram showing a more detailed structure of the bypass scan path shown in FIG. 13. In the drawing, scan register 41 is structured by connecting a plurality of SRL in series. Data (selection data, mode data or test data) serially input from an SI terminal 401 is applied to one input end of an AND gate 402 and is also applied to one input end of MUX 43 through bypass line 42. A selection signal SL output from selection data propagation holding register 44 is applied to the other input end of AND gate 402. The output of AND gate 402 is applied to an SRL in the first stage of scan register 41. The output of an SRL in the last stage of scan register 41 is applied to the other input end of MUX 43. MUX 43 receives the selection signal SL from selection data propagation holding register 44 and selects a register path (the path passing through scan register 41) or a bypass path (the path passing through bypass line 42) as a data propagation line. The output of MUX 43 is applied to an SO terminal 403 through selection data propagation holding register 44 and mode data propagation holding register 45. SO terminal 403 is connected to SI terminal 401 of bypass scan path 4b in the subsequent stage or to SO terminal 32.

Selection data propagation holding register 44 and mode data propagation holding register 45 receive various control signals input from an input terminal 404. The control signals include a reset signal RST, a mode latch signal ML and shift clock signals SC1 and SC2. Various control signals input from an input terminal 405 are applied to each SRL of scan register 41. The control signals include a strobe signal STB, a timing signal TG and shift clock signals SC1 and SC2. Input terminals 404 and 405 are connected to control signal input terminal 33 of FIG. 12. Each SRL receives a test mode signal TM output from mode data propagation holding register 45.

Each of input terminals 411–415 is connected to a DI terminal (data input terminal) of the corresponding SRL of scan register 41. Each of output terminals 421–425 is connected to a DO terminal (data output terminal) of the corresponding SRL of scan register 41. Each of input terminals 411–415 is connected to an observation point of the corresponding function module or the system data input terminal of the integrated circuit device. Each of output terminals 421–425 is connected to a control point of the corresponding function module or the system data output terminal of the integrated circuit device. With bypass scan path 4a arranged as shown in FIG. 12, for example, input terminals 411–415 are connected to system data input terminals 20a–20f of integrated circuit device 1, while output terminals 421–425 are connected to the control points of the corresponding function modules 11. In a test operation, each SRL of scan register 41 holds test data input from SI terminal 401 and outputs the held test data to output terminals 421–425. Each SRL also holds test result data input from input terminals 411–415. In a normal operation, each SRL propagates system data input from input terminals 411–415 to output terminals 421–425.

FIG. 15 is a block diagram showing a more detailed structure of selection data propagation holding register 44 of FIG. 14. In the drawing, selection data propagation holding register 44 comprises latch circuits 441 and 442 and a latch circuit 443 with a reset input. Each of latch circuits 441–443 is structured so as to latch data applied to a data terminal D when a trigger signal applied to a trigger terminal T is at a high level. Latch circuit 443 with a reset input is structured to have latch contents forcibly reset in response to a reset signal applied to a reset terminal R.

Data terminal D of latch circuit 441 receives input data from an SI terminal 446. The output data of an output terminal Q of latch circuit 441 is applied to respective data terminals D of latch circuits 442 and 443. The output data of an output terminal Q of latch circuit 442 is applied to an SO terminal 450. The output data of an output terminal Q of latch circuit 443 is applied to a DO terminal 449. Trigger terminals of latch circuits 441 and 442 respectively receive shift clock signals SC1 and SC2 from input terminals 447 and 448. When shift clock signals SC1 and SC2 are applied as non-overlapping two-phase clock signals, latch circuits 441 and 442 constitute a shift register for data propagation between SI terminal 446 and SO terminal 450. A trigger terminal T of latch circuit 443 receives a mode latch signal ML from an input terminal 445. Reset terminal R of latch circuit 443 receives a reset signal RST from an input terminal 444.

Input terminals 444, 445, 447 and 448 are connected to control signal input terminal 33 of FIG. 12 thorough input terminal 404 of FIG. 14. SI terminal 446 is connected to the output end of MUX 43. SO terminal 450 is connected to mode data propagation holding register 45. DO terminal 449 is connected to the input end of AND gate 402 and to the input end of MUX 43.

Mode data propagation holding register 45 of FIG. 14 is similarly structured to selection data propagation holding register 44 shown in FIG. 15, with a difference in that SI terminal 446 in a case of mode data propagation holding register 45 is connected to SO terminal 450 of selection data propagation holding register 44. In addition, SO terminal 450 is connected to SO terminal 403 of FIG. 14. DO terminal 449 is connected to SRL of scan register 41.

FIG. 16 is a block diagram showing a more detailed structure of SRL of FIG. 14. In the drawing, SRL comprises a two-input latch circuit 501, one-input latch circuits 502 and 503 and a selector 504. two-input latch circuit 501 is structured so as to latch data input to a first data terminal D1 when a first trigger signal input to a first trigger terminal T1 is at a high level and latches data input to a second data terminal D2 when a second trigger signal input to a second trigger terminal T2 is at a high level. One-input latch circuits 502 and 503 have the same structure as those of latch circuits 441 and 442 of FIG. 15.

First data terminal D1 of latch circuit 501 receives input data from an SI terminal 508 and second data terminal D2 receives the output of selector 504. First trigger terminal T1 of latch circuit 501 receives a shift clock signal SC1 input from an input terminal 509 and second trigger terminal T2 receives a strobe signal STB input from an input terminal 507. Data output from an output terminal Q of latch circuit 501 is applied to a data terminal D of latch circuit 502 and is also applied to one input end of selector 504. The other input terminal of selector 504 receives data input from a DI terminal 506. Selector 504 receives a test mode signal TM input from an input terminal 505 as a switch control signal. The output of selector 504 is applied to second data terminal D2 of latch circuit 501 as described above, it is also applied to a data terminal D of latch circuit 503. A trigger terminal T of latch circuit 503 receives a timing signal TG from an input terminal 510. Data output from an output terminal Q of latch circuit 503 is applied to a DO terminal 512. A trigger terminal T of latch circuit 502 receives a shift clock signal SC2 input from an input terminal 511. Data output from an output terminal Q of latch circuit 502 is applied to an SO terminal 513.

Latch circuits 501 and 502, with the respective trigger terminals T1 and T being supplied with shift clock signals SC1 and SC2, constitute a shift register for data propagation between SI terminal 508 and SO terminal 513. Latch circuit 501 latches the output signal of selector 504 in response to strobe signal STB applied from input terminal 507. Latch circuit 503 latches the output signal of selector 504 in response to timing signal TG input from input terminal 510.

Input terminal 505 is connected to DO terminal 449 (see FIG. 15) of mode data propagation holding register 45 of FIG. 14. Input terminals 507, 509–511 are connected to control signal input terminal 33 of FIG. 12 through input terminal 450 of FIG. 14. DI terminal 506 is connected to one of input terminals 411–415 of FIG. 14. SI terminal 508 is connected to SO terminal 513 of a preceding stage SRL. SI terminal 508 of the first stage SRL of scan register 41 is connected to the output end of AND gate 402. DO terminal 512 is connected to one of output terminals 421–425 of FIG. 14. SO terminal 513 is connected to SI terminal 518 of a succeeding stage SRL. SO terminal 513 of the last stage SRL of scan register 41 is connected to the input end of MUX 43.

Operation of the conventional integrated circuit device shown in FIG. 12 will be described. The operation of the conventional integrated circuit device includes a normal operation and a test operation. In a normal operation, system data input through system data input terminals 20a–20k of FIG. 12 is processed at the respective function modules 11–13 and the processing result is externally output through system data output terminals 21a–21j. At this time, each SRL of each of bypass scan paths 4a–4d simply operates as a driver to transmit data between input terminals 411–415 and output terminals 421–425 (see FIG. 14).

A test operation is executed following the procedure shown in FIG. 17. At step S1, a selection mode is executed wherein a bypass scan path necessary for the test is selected. At the step S2, a test mode is executed wherein test data is applied to a function module to be tested to output test result data. The selection mode at step S1 and the test mode at step S2 are executed for each of function modules 11–13. A determination of the end of the test for all the function modules made at step S3 completes the test operation.

FIG. 18 is a flow chart showing the more detailed procedure of processing of the selection mode at the step SI of FIG. 17. With reference to FIG. 18, a reset operation is first executed at step S11 in the selection mode. The reset operation selects a bypass path in each of bypass scan paths 4a–4d. Then, shift-in of selection data is executed at step S12. That is, selection data and mode data are serially input from SI terminal 31 of FIG. 12. The input selection data and mode data are sequentially propagated through the respective bypass scan paths 4a–4d. At step S13, the selection data is set in selection data propagation holding register 44 of each bypass scan path and the mode data is set in mode data propagation holding register 45. Either a register path or a bypass path is selected based on the selection data set in selection data propagation holding register 44. As a result, only a register path is selected in the bypass scan path connected to the function module to be tested, while bypass paths are selected in the other bypass scan paths, reducing a data propagation line length of scan path 4.

FIG. 19 is a flow chart showing the more detailed procedure of the processing of the test mode at step S2 of FIG. 17. With reference to FIG. 19, shift-in of test data is executed at step S21 in the test mode. That is, test data is serially input from SI terminal 31 of FIG. 12. The input test data is propagated through the scan path and set in each SRL of the bypass scan path connected to the control point of the function module to be tested. At step S23, application and capture of test data is carried out. That is, the test data set in each SRL is applied to the control point of the function module to be tested. The function module processes the applied test data based on the function logic. At step S24, shift-out of the test result data is executed. That is, the data (test result data) processed by the function module is latched by SRL connected to the observation point of the function module. The test result data latched by each SRL is sequentially propagated through the scan path and serially output from SO terminal 32 of FIG. 12 to the outside. By externally verifying the test result data output from SO terminal 32, a determination can be made as to whether the selected function module operates normally or not. The operations at steps S21–S24 are repeatedly executed with a test pattern changed. The end of the test by all the test patterns is determined at step S25 to terminate the test mode.

The foregoing is the description of the schematic operation of the conventional integrated circuit device shown in FIG. 12 with reference to FIGS. 17–19. A more detailed operation in testing the function module 11 of FIG. 12 will be described in the following with reference to FIGS. 20 and 21.

FIG. 20 is a timing chart showing the operation of the respective SRL of bypass scan path 4a each connected to a control point of selected function module 11 to be tested. FIG. 21 is a timing chart showing the operation of the respective SRL of bypass scan paths 4b and 4c each connected to an observation point of the selected function module 11 to be tested. The dotted lines in FIGS. 19 and 21 show arbitrary data not defined.

(1) Normal operation

In a normal operation, strobe signal STB and shift clock signals SC1 and SC2 applied to each SRL of each of bypass scan paths 4a–4d are fixed to a L level. The data held in latch circuits 501 and 502 of each SRL do not change. At this time, latch circuit 443 of each mode data propagation holding register 45 is reset by reset signal RST. Test mode signal TM output from mode data propagation holding register 45 is therefore at a low level. Selector 504 accordingly selects data input from DI terminal 506. Timing signal TG applied to trigger terminal T of latch circuit 503 is fixed to a high level. Latch circuit 503 is therefore ready to capture output data of selector 504. System data input from DI terminal 506 is accordingly output to DO terminal 512 through selector 504 and latch circuit 503. That is, each SRL at this time simply functions as a driver.

System data input through system data input terminals 20a–20k of FIG. 12 are processed by the respective function modules 11–13 and externally output through system data output terminals 21a–21j.

(2) Operation in a test

Operation in testing function module 11 will be described for a selection mode and a test mode of FIG. 17.

1. Operation in selection mode (a) Reset

Reset signal RST input through control signal input terminal 33 of FIG. 12 is brought to a high level, thereby resetting latch circuit 443 in selection data propagation holding register 44 of each of bypass scan paths 4a–4d. As a result, the output of latch circuit 443 attains a low level. The low level output of latch circuit 443 is applied to AND gate 402 and MUX 43 through DO terminal 449 as a selection signal SL. In response thereto, the output of AND gate 402 is fixed to a low level to prevent data input through SI terminal 401 from being transmitted to scan register 41. MUX 43 selects a signal propagated by a bypass path, that is, bypass line 42.

The above-described operation is carried out in each of bypass scan paths 4a–4d. A bypass path is selected in each of all the bypass scan paths 4a–4d.

(b) Selection data shift-in

Selection and mode data are serially input through SI terminal 31 of FIG. 12. The input selection data and mode data are first applied to SI terminal 401 of bypass scan path 4a. In bypass scan path 4a, the selection data and the mode data are applied to SI terminal 446 of selection data propagation holding register 44 through bypass line 42 and MUX 43. At this time, with the respective trigger terminals of latch circuits 441 and 442 being supplied with non-overlapping two-phase shift clock signals SC1 and SC2, the input selection data and mode data are sequentially shifted by latch circuits 441 and 442. That is, when shift clock signal SC1 rises to a high level, latch circuit 441 latches the data input though SI terminal 446. When shift clock signal SC2 subsequently rises to a high level, latch circuit 442 captures and latches the data latched by latch circuit 441. The output data of latch circuit 442 is applied to mode data propagation holding register 45 through SO terminal 450. With mode data propagation holding register 45 having the same structure as that of selection data propagation holding register 44, the selection data input through selection data propagation holding register 44 is sequentially shifted by latch circuits 441 and 442 of mode data propagation holding register 45 and output to SO terminal 450.

The selection data output from mode data propagation holding register 45 is applied to a subsequent stage bypass scan path 4b through SO terminal 403. Also in bypass scan path 4b, the same operation as in the above-described bypass scan path 4a is performed. This is also the case with the other scan path units 4c and 4d. As a result, the selection data and the mode data input through SI terminal 31 of FIG. 12 are propagated through the bypass paths of the respective bypass scan paths 4a–4d.

(c) Setting of selection data

When the input selection data and mode data are shifted to a predetermined position of scan path 4, a mode latch signal ML input through control signal input terminal 33 of FIG. 12 is brought to a high level. In response to the mode latch signal ML, latch circuit 443 of selection data propagation holding register 44 and mode data propagation holding register 45 in each of bypass scan paths 4a–4d respectively capture and latch selection data and mode data stored in the respective latch circuits 441 at that time.

At this time, latch circuit 443 of selection data propagation holding register 44 in bypass scan path 4a latches high level selection data. As a result, the output data of selection data propagation holding register 45 in bypass scan path 4a, that is, the selection signal SL attains a high level. The high level selection signal SL is applied to AND gate 402 and MUX 43 through DO terminal 449. In response thereto, AND gate 402 transmits the input data from SI terminal 401 to scan register 41. MUX 43 selects the output data of scan register 41.

The same operation is carried out in bypass scan paths 4b and 4c connected to function module 11 to be tested, thereby selecting a register path. On the other hand, in bypass scan path 4d not connected to function module 11, low level selection data is set in a selection data propagation holding register 44 to still select a bypass path.

In mode data propagation holding register 45 in bypass scan path 4a, high level mode data is latched by latch circuit 443. The high level mode data latched by latch circuit 443 is applied to selector 504 of each SRL in bypass scan path 4a as test mode signal TM. As a result, selector 504 of each SRL in bypass scan path 4a selects output data of latch circuit 501.

In mode data propagation holding register 45 in each of bypass scan paths 4b and 4c, latch circuit 443 latches low level mode data. The low level mode data latched by latch circuit 443 is applied to selector 504 in each SRL as test mode signal TM. As a result, selector 504 in each SRL of each of bypass scan paths 4b and 4c selects input data from DI terminal 506.

Either of high level and low level mode data can be set in mode data propagation holding register 45 in bypass scan path 4d.

(2) Operation in test mode (a) Test data shift-in

Test data for function module 11 is serially input from SI terminal 31 in FIG. 12. The test data is applied to bypass scan path 4a and applied to scan register 41 from SI terminal 401 through AND gate 402. At this time, trigger terminals T1 and T2 of latch circuits 501 and 502 of each SRL are being supplied with non-overlapping two-phase clock signals SC1 and SC2. The test data input to SRL is therefore sequentially shifted by latch circuits 501 and 502 and output to SO terminal 513. The test data input to shift register 41a is propagated through the respective SRL in a serial manner.

When the test data input from SI terminal 31 reaches each SRL of bypass scan path 4a, input and shift of the test data is stopped.

(b) Application and capture of test data

When the shift-in of the test data is terminated, timing signal TG is brought to a high level as shown in FIG. 20. As a result, latch circuit 503 of each SRL in bypass scan path 4a captures and latches output data of selector 504. At this time, test mode signal TM applied from mode data propagation holding register 45 to selector 504 attains a high level, whereby selector 504 selects output data of latch circuit 501. As a result, the test data held by latch circuit 501 is applied to DO terminal 512 through selector 504 and latch circuit 503. The test data output from DO terminal 512 of each SRL is applied to the control points of function module 11 through output terminals 421–425 of FIG. 14. In response thereto, function module 11 processes the applied test data and outputs processing result data (test result data) through the observation points.

In bypass scan path 4b, strobe signal STB is brought to a high level as shown in FIG. 21. In response thereto, latch circuit 501 of SRL in bypass scan path 4b captures output data of selector 504. At this time, with test mode signal TM applied from mode data propagation holding register 45 to selector 504 being at a low level, selector 504 selects input data from DI terminal 506. DI terminal 506 is being supplied with test data result output from the observation points of function module 11. The test result data of function module 11 is therefore latched by latch circuit 501 of each SRL in bypass scan path 4b. The same operation as of the above-described bypass scan path 4b is performed also in bypass scan path 4c.

(c) Test data result shift-out

When scan register 41 of each of bypass scan paths 4b and 4c finishes capturing the test data result, non-overlapping two-phase shift clock signals SC1 and SC2 are applied to bypass scan paths 4a–4d. In response thereto, scan register 41, selection data propagation holding register 44 and mode data propagation holding register 45 in each of bypass scan paths 4a–4d shifts the test result data in synchronization with shift clock signals SC1 and SC2 and applies the shifted test result data to the subsequent bypass scan path 4d.

In bypass scan path 4d, a bypass path is selected at the time of resetting a selection mode as described above. In bypass scan path 4d, therefore, the input test result data is applied to selection data propagation holding register 44 through bypass line 42 and MUX 43 without passing through scan register 41. The test result data is further shifted by selection data propagation holding register 44 and mode data propagation holding register 45 in turn and externally output from SO terminal 32 of FIG. 12 in a serial manner.

As described in the foregoing, a conventional integrated circuit device comprises bypass scan paths 4a–4d each including selection data propagation holding register 44 and mode data propagation holding register 45 connected in series to the output of MUX 43. Therefore, irrespective of selection of a bypass path and a register path, selection data propagation holding register 44 and mode data propagation holding register 45 in each of bypass scan paths 4a–4d shift data when propagating test data or test result data. However, selection data propagation holding register 44 and mode data propagation holding register 45 are used for simply shifting the data at the time of propagation of test data or test result data. Selection data propagation holding register 40 and mode data propagation holding register 45 therefore undesirably increase a bit lengthof a data propagation path, thereby increasing a propagation time period of test data or test result data. In addition, since test is executed in a plurality of test patterns for each function module, an increase in a time period of one data propagation is accumulated to significantly increase the total test time period of the integrated circuit device.

"IMPLEMENTING MACRO TEST IN SILICON COMPILER DESIGN" by Frans Beenker, Rob Dekker, Rudi Stans and Max Van der Star, IEEE Design & TEST of Computers, April 1990 discloses a test circuit for an integrated circuit device without a selection data holding register and a mode data holding register. The test circuit shown in the prior art article includes a scan path divided into a plurality of bypass scan paths each for each function module. Each bypass scan path is structured such that a register path and a bypass path can be selected by a multiplexer. Operation of each bypass path is controlled in response to a control signal from a test control block.

The test circuit disclosed in the prior art article advantageous in reducing a bit length of a data propagation path, involves another problem. That is, operation of each bypass scan path concentratedly controlled by a test control block results in a concentrated arrangement of control signal wirings in the proximity of the test control block. A large wiring region should be therefore provided in the proximity of the test control block. In general, signal wirings efficiently arranged between internal circuits of an integrated circuit device do not involve a large increase of a chip area. The test circuit disclosed in the above-described prior art article requires an additional wiring region for arranging signal wirings to deteriorate wiring efficiency, resulting in an increase in a chip area.

In the test circuit disclosed in the above-described prior art article, selection data for selecting either a bypass path or a register path is not propagated through a scan path but is externally applied to a test control block and then applied to each bypass scan path. It is therefore necessary to provide an additional selection data input pin for inputting external selection data on an integrated circuit chip. The test circuit disclosed in the above-described prior art article also has the disadvantage of an increase in the number of pins.

SUMMARY OF THE INVENTION

An object of the present invention is to provide a bypass scan path allowing a data propagation time period to be made short and a chip area and the number of pins to be reduced and an integrated circuit device using such a bypass scan path.

The bypass scan path according to the present invention applicable to an integrated circuit device including at least one control point and at least one observation point, propagates externally applied control point data to the control point and propagates observation point data obtained at the observation point to externally output the same, and the bypass scan path includes a single data input terminal, a single data output terminal, a scan register device, a bypass device, a selection data propagation holding device and a selection device. The data input terminal serially inputs selection data for selecting a data propagation path and control point data. The data output terminal serially outputs observation point data. The scan register device is structured by a serial connection of at least one shift register latch coupled to the control point and/or the observation point and provided between the data input terminal and the data output terminal to shift and hold the control point data and the observation point data. The bypass device is provided between the data input terminal and the data output terminal to form a bypass path of data bypassing the scan register device. The selection data propagation holding device is arranged in parallel to at least scan register device and shifts and holds selection data input through the data input terminal. The selection device selects either a register path constituted by the scan register device or a bypass path constituted by the bypass device as a control point data propagation path or an observation point data propagation path based on the selection data held by the selection data propagation holding means and connects the selected path to the data output terminal.

The integrated circuit device according to the present invention with a plurality of control points and a plurality of observation points provided therein includes a single external data input terminal, a single external data output terminal and at least one bypass scan path. The external data input terminal serially inputs selection data for selecting a data propagation path and control data to be applied to the control points. The external data output terminal serially outputs observation point data obtained at the observation points. Each bypass scan path is connected in series between the external data input terminal and the external data output terminal to form a serial propagation path for selection data, control point data and observation point data. The bypass scan path includes a single internal data input terminal, a single internal data output terminal, a scan register device, a bypass device, a selection data propagation holding device and a selection device. The internal data input terminal serially inputs selection data and control point data. The internal data output terminal serially outputs observation point data. The scan register device constituted by serial connection of at least one shift register latch coupled to a control point and/or an observation point is provided between the internal data input terminal and internal data output terminal to shift and hold control point data and observation point data. The bypass device is provided between the internal data input terminal and the internal data output terminal to form a data bypass path bypassing the scan register device. The selection data propagation holding means is arranged in parallel to at least the scan register device and shifts and holds selection data input from the internal data input terminal. The selection device selects either a register path constituted by the scan register device or a bypass path constituted by the bypass device as a propagation path for control point data and observation point data based on the selection data held by the selection data propagation holding means and connects the selected path to the internal data output terminal.

According to the present invention, the selection data propagation holding device is arranged in parallel to at least the scan register device. Therefore, when the selection device selects the register path as a propagation path for control point data and observation point data, the selection data propagation holding device is arranged outside the propagation path for the control point data and the observation point data. As a result, the bit length of the data propagation path is reduced to reduce a data propagation time period.

In addition, selection data is input from an external data input terminal and propagated through each bypass scan path according to the present invention, it is not necessary to provide an additional pin for inputting selection data.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 is a timing chart showing operation of a SRL connected to an observation point of a function module to be tested in the conventional integrated circuit device.

DESCRIPTION OF THE PREFERRED EMBODIMENTS

Figure 1:
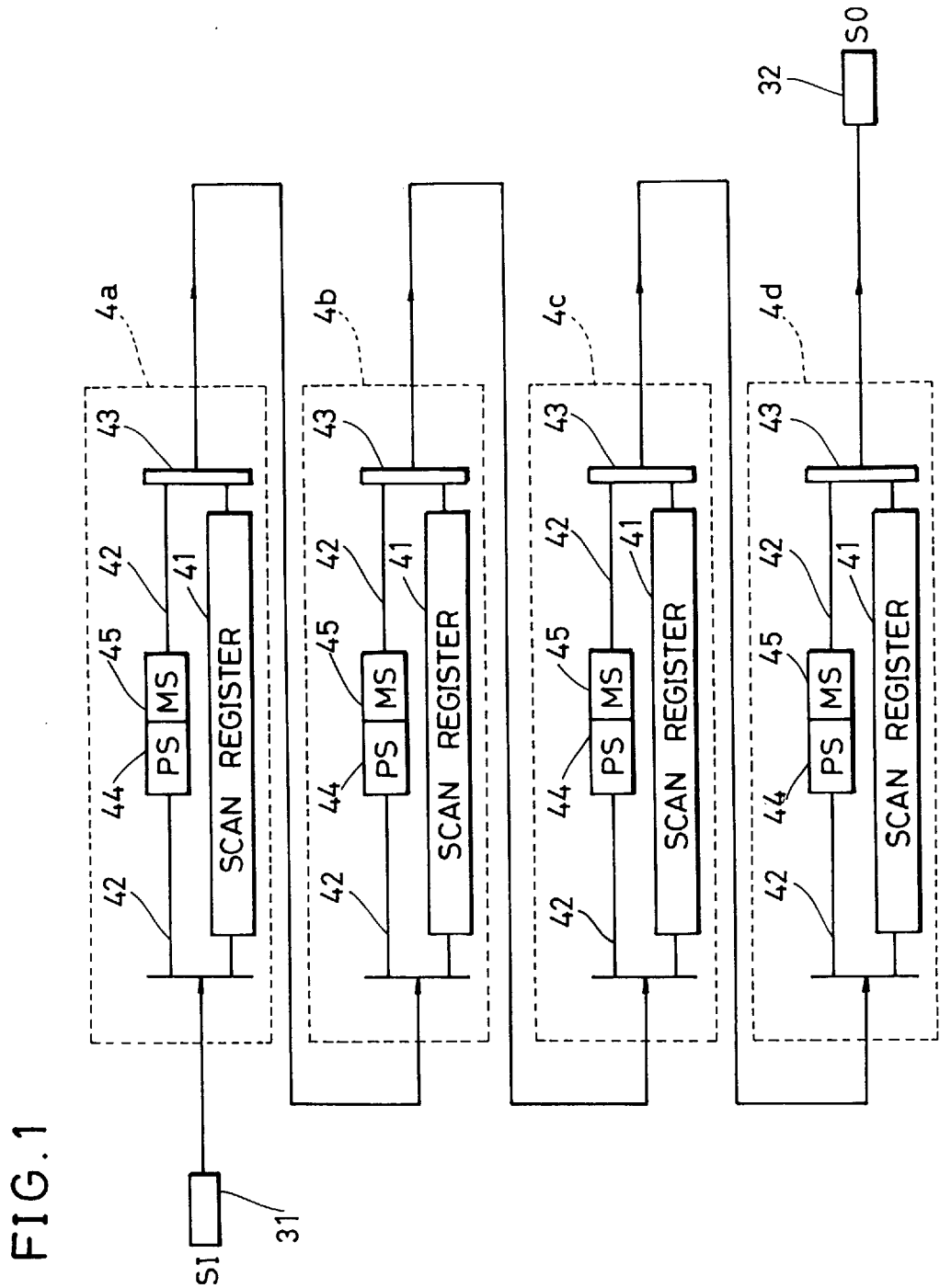
FIG. 1 is a block diagram showing a structure of a scan path according to one embodiment of the present invention.
Figure 2:
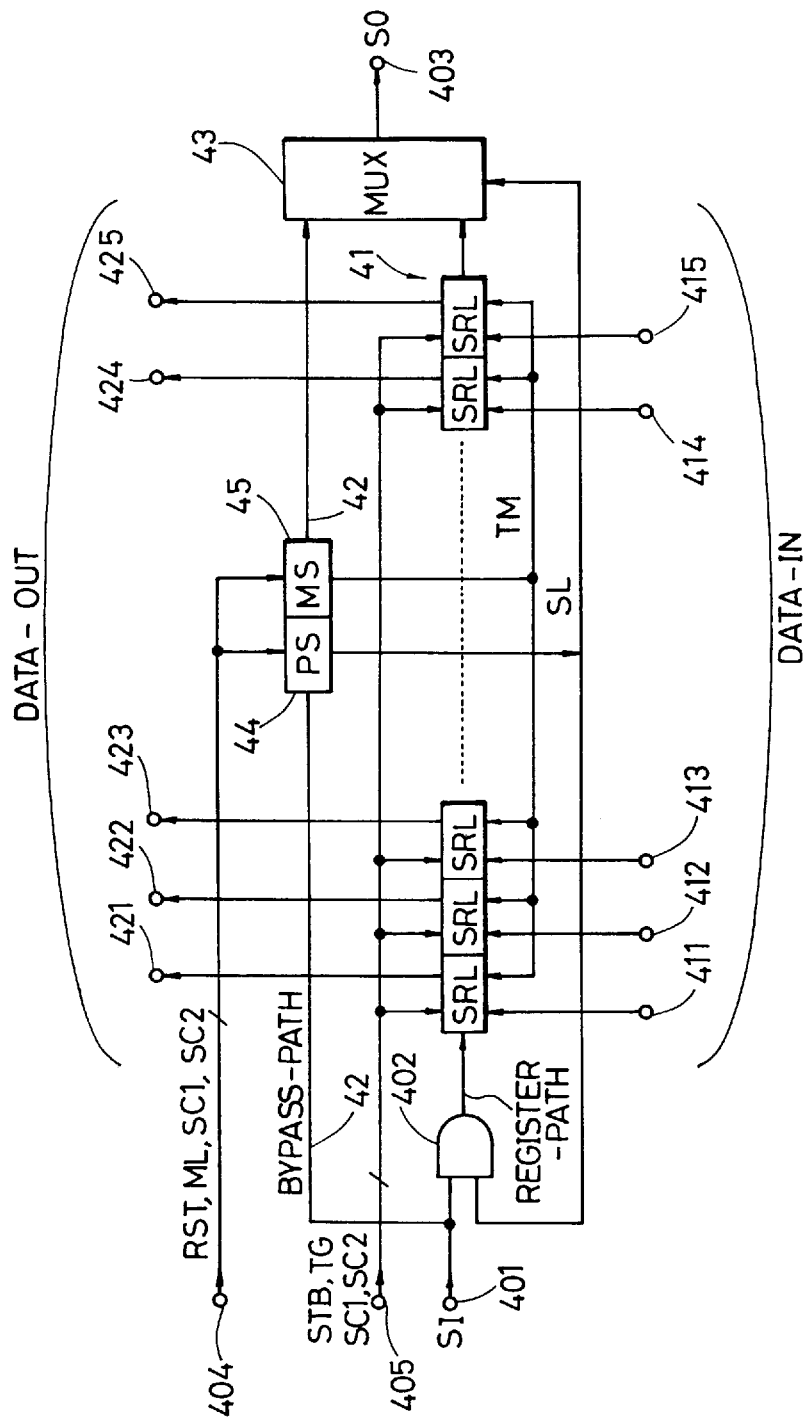
FIG. 2 is a block diagram showing a more detailed structure of the bypass scan path of FIG. 1.

FIG. 1 is a block diagram showing a structure of a scan path according to one embodiment of the present invention. FIG. 2 is a block diagram showing a more detailed structure of a bypass scan path of FIG. 1. The structure of the embodiment shown in FIGS. 1 and 2 is the same as that of the conventional scan path shown in FIGS. 12 to 16 except the following points, and the same reference numerals are allotted to the corresponding portions of which description is omitted.

Figure 16:
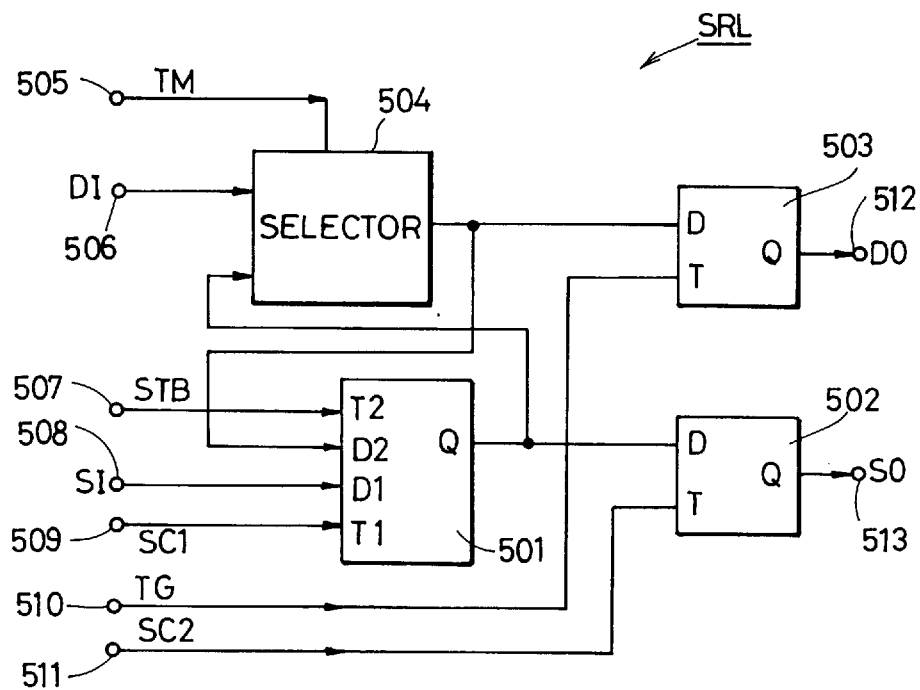
FIG. 16 is a block diagram showing a more detailed structure of a SRL of FIG. 14.
Figure 17:
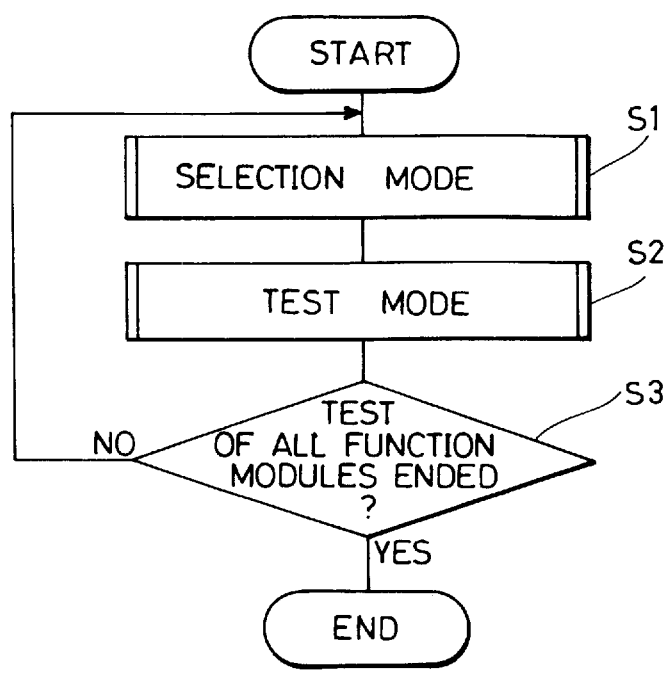
FIG. 17 is a flow chart showing the procedure of a test operation in the conventional integrated circuit device shown in FIG. 12.
Figure 18:
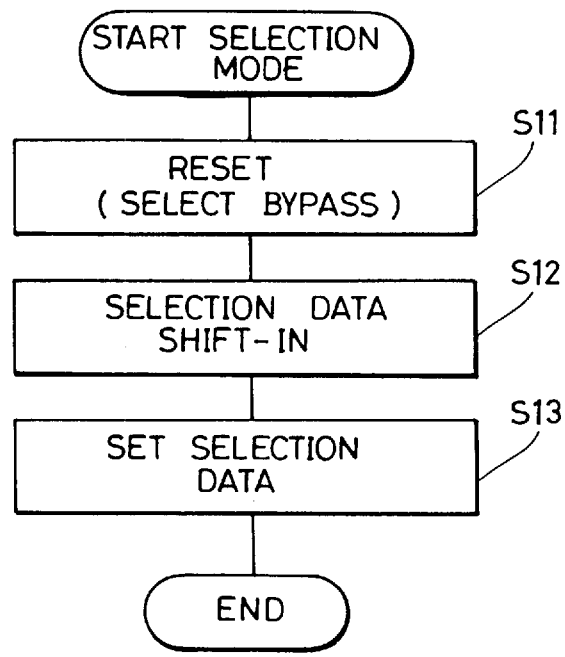
FIG. 18 is a flow chart showing the procedure of more detailed processing at step S1 of FIG. 17.
Figure 19:
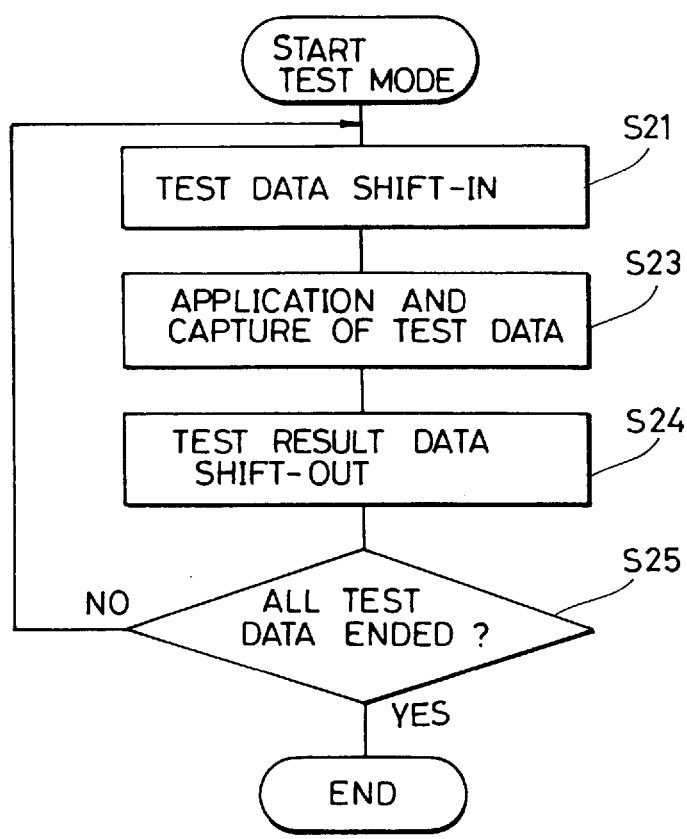
FIG. 19 is a flow chart showing the procedure of a more detailed processing at step S2 of FIG. 17.
Figure 20:
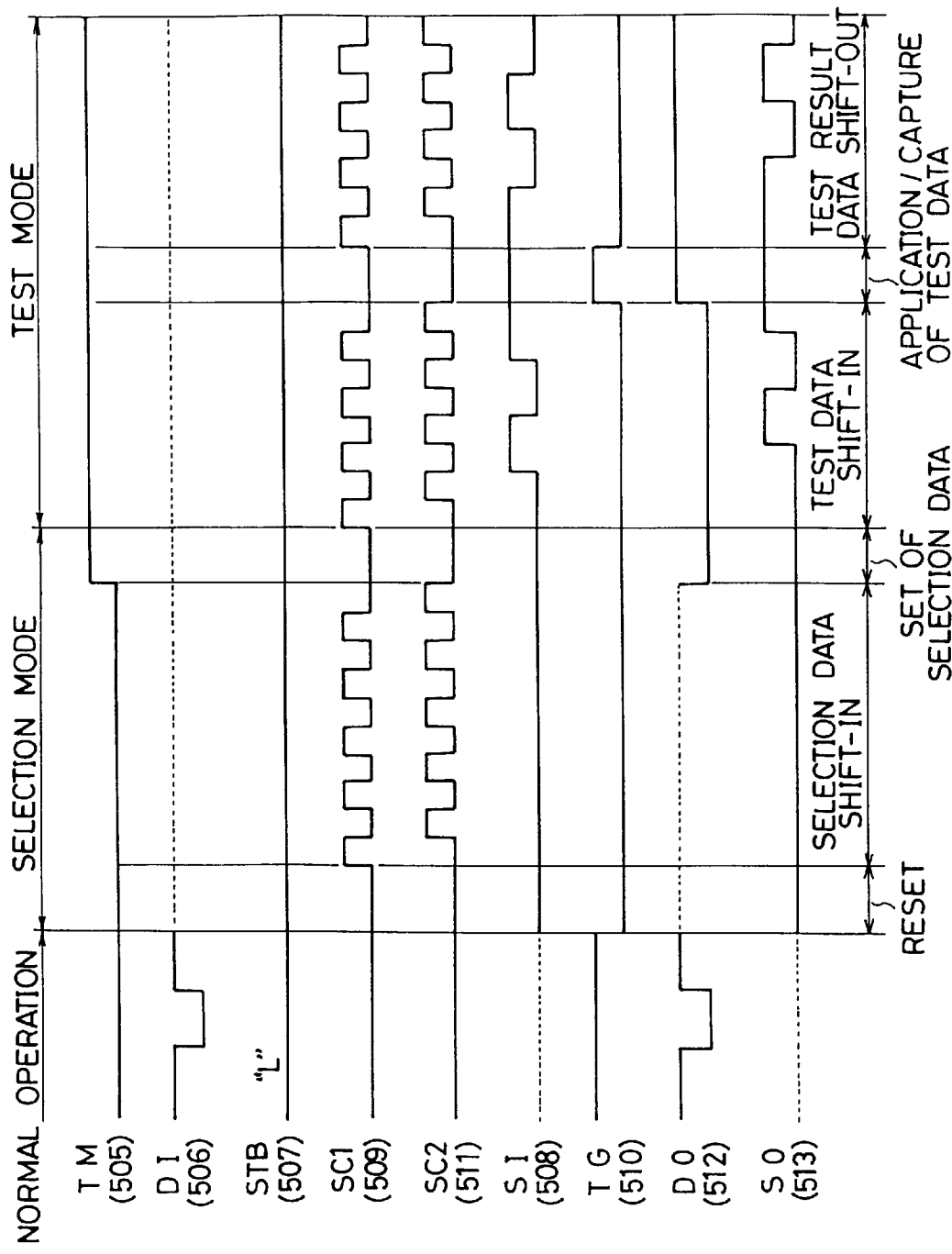
FIG. 20 is a timing chart showing operation of the SRL connected to a control point of a function module to be tested in a conventional integrated circuit device.

According to the embodiment shown in FIGS. 1 and 2, a selection data propagation holding register 44 and a mode data propagation holding register 45 are provided on a bypass path constituted by a bypass line 42. Selection data propagation holding register 44 and mode data propagation holding register 45 are respectively structured similarly to those shown in FIG. 15. SI terminal 446 of selection data propagation holding register 44 is connected to bypass line 42, while SO terminal 450 of mode data propagation holding register 45 is connected to bypass line 42. Each SRL in a scan register 41 is structured as shown in FIG. 16.

Figure 12:
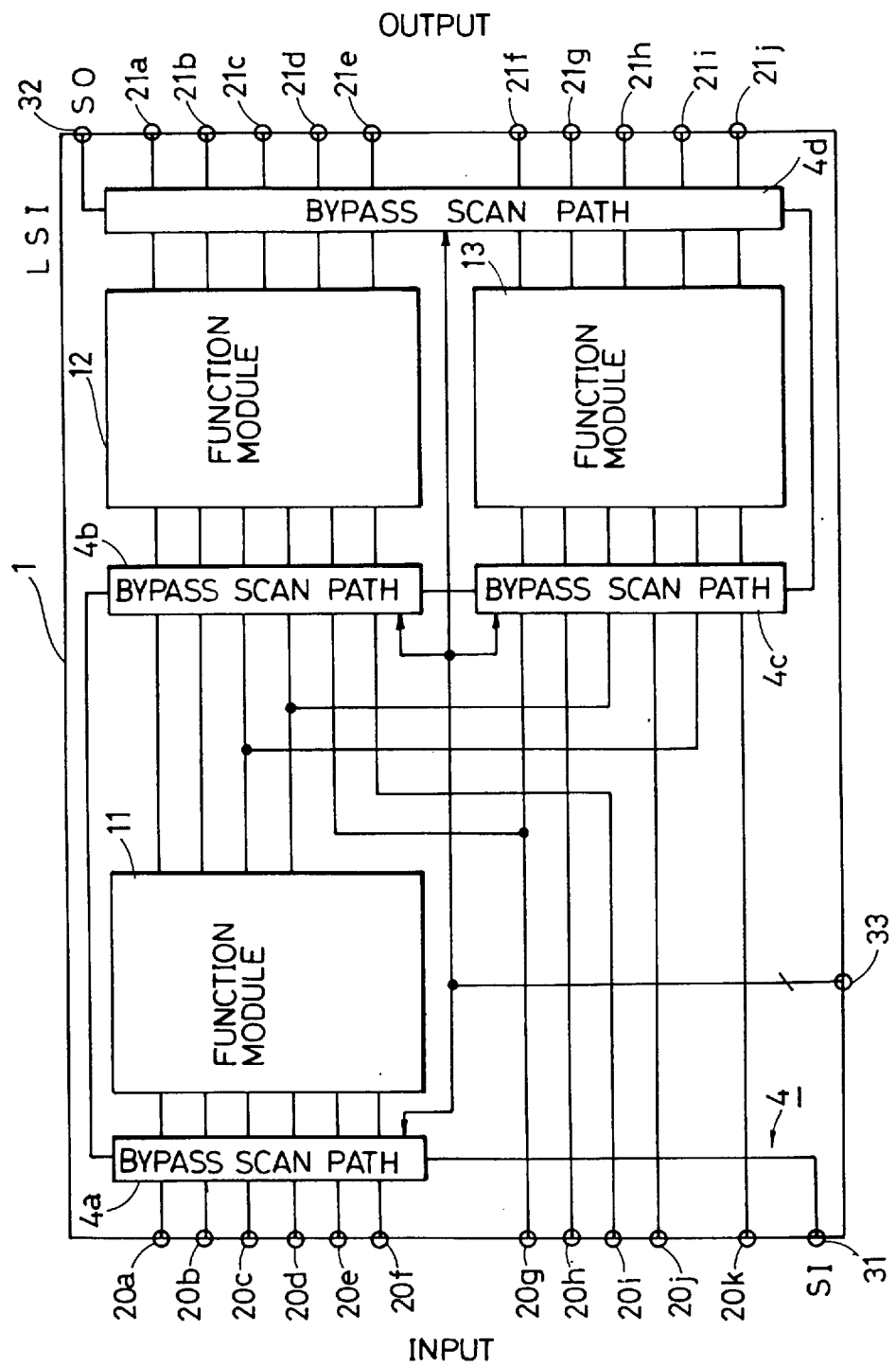
FIG. 12 is a block diagram showing one example of a structure of a conventional integrated circuit device having a scan architecture.

The scan path shown in FIG. 1 is arranged on an integrated circuit device 1 in such a manner as shown in FIG. 12, for example.

Operation of the embodiment shown in FIGS. 1 and 2 will be described in the following.

(1) Normal operation

The normal operation is completely the same as that of the conventional scan path shown in FIGS. 12–16. That is, each SRL of bypass scan paths 4a–4d simply functions as a driver for passing system data between DI terminal 506 and DO terminal 512 of FIG. 16. Each SRL therefore does not prevent the flow of the system data propagating through respective function modules 11–13.

(2) Test operation

[1] Operation in selection mode (a) Reset

A reset operation is completely the same as that of the conventional scan path shown in FIGS. 12–16. That is, reset signal RST is brought to a high level to reset latch circuit 443 (see FIG. 15) in each selection data propagation holding register 44 in each of bypass scan paths 4a–4d. As a result, selection signal SL output from selection data propagation holding register 44 attains a low level to select a bypass path in each of bypass scan paths 4a–4d.

(b) Selection data shift-in

Selection data and mode data are serially input from SI terminal 31. The input selection data and mode data are sequentially propagated through a bypass path, that is, bypass line 42 in each of bypass scan paths 4a–4d. At this time, selection data propagation holding register 44 and mode data propagation holding register 45 provided at the bypass path shift the selection data in synchronization with shift clock signals SC1 and SC2.

(c) Setting of selection data

A setting operation of the selection data is completely the same as that of the conventional scan path shown in FIGS. 12–16. More specifically, when input selection data is shifted to a predetermined position on a scan path, a mode latch signal ML to be applied to selection data propagation holding register 44 and mode data propagation holding register 45 attains a high level. As a result, latch circuit 443 in selection data propagation holding register 44 latches selection data, while latch circuit 443 in mode data propagation holding register 45 latches mode data.

[2] Operation in test mode (a) Test data shift-in

Test data is serially input from SI terminal 31. The test data is propagated through the respective bypass scan paths to be set in a predetermined SRL in a predetermined bypass scan path. Such operation will be described in cases where bypass scan path 4a selects a register path and where the same selects a bypass path.

In a case where a bypass scan path 4a selects a register path, AND gate 402 in bypass scan path 4a propagates an input signal applied to SI terminal 401 to scan register 41, while MUX 43 selects the output of scan register 41. Test data serially input from SI terminal 401 is therefore input to scan register 41 through AND gate 402. Each SRL of scan register 41 sequentially shifts the test data in synchronization with shift clock signals SC1 and SC2. The output data of scan register 41 is applied from SO terminal 403 to a bypass scan path 4b in the subsequent stage through MUX 43.

When bypass scan path 4a selects a bypass path, the output of AND gate 402 is fixed to a low level, while MUX 43 selects bypass line 42. Test data serially input from SI terminal 401 is therefore applied to selection data propagation holding register 44 through bypass line 42. Selection data propagation holding register 44 and mode data propagation holding register 45 sequentially shift the test data in synchronization with shift clock signals SC1 and SC2. The output of mode data propagation holding register 45 is applied from SO terminal 403 to a bypass scan path 4b in the subsequent stage through MUX 43.

The same operation as described above is performed in each of the other bypass scan paths 4b–4d.

(b) Application and capture of test data

Application and capture of test data are completely the same as that of the conventional scan path shown in FIGS. 12–16. That is, a SRL wherein test data is set applies test data to control points of a function module selected for a test. The selected function module processes the applied test data in accordance with its internal function logic to output processing result data (test result data) from its observation points. The test result data output from the observation points are captured and held by SRL connected to the observation points. Test data result output from the observation points of function module 11, for example, are captured and held by the respective SRL of each of bypass scan paths 4b and 4c.

(c) Test result data shift-out

The test result data captured by predetermined SRL are sequentially shifted to be externally output from SO terminal 32 in a serial manner. An operation at this time will be described in a case where test result data held by bypass scan paths 4b and 4c are shifted, as an example.

The respective SRL of scan register 41 in bypass scan path 4b sequentially shift the captured test result data in synchronization with shift clock signals SC1 and SC2. At this time, with MUX 43 in bypass scan path 4b selecting the output data of scan register 41, the test data result output from scan register 41 is applied from SO terminal 403 to bypass scan path 4c in the subsequent stage through MUX 43.

In bypass scan path 4c selecting a register path, exactly the same operation as in the above-described bypass scan path 4b is performed. More specifically, each SRL shifts latched test result data, while shifting test result data applied from bypass scan path 4b. In this way, the test result data shifted by scan register 41 is applied to bypass scan path 4d in the subsequent stage through MUX 43.

In bypass scan path 4d selecting a bypass path, the input test result data is propagated on bypass line 42. At this time, selection data propagation holding register 44 and mode data propagation holding register 45 shift the test result data in synchronization with shift clock signals SC1 and SC2. The test result data shifted by selection data propagation holding register 44 and mode data propagation holding register 45 is externally output from SO terminal 32 through MUX 43.

As described in the foregoing, since selection data propagation holding register 44 and mode data propagation holding register 45 are connected in parallel to scan register 41 in the embodiment shown in FIGS. 1 and 2, the selection data holding register and the mode data holding register do not perform a shifting operation at the time of shifting in test data to set the same in SRL of a predetermined scan register and shifting out test result data. It is therefore possible to reduce a propagation time of test data and test result data.

Figure 13:
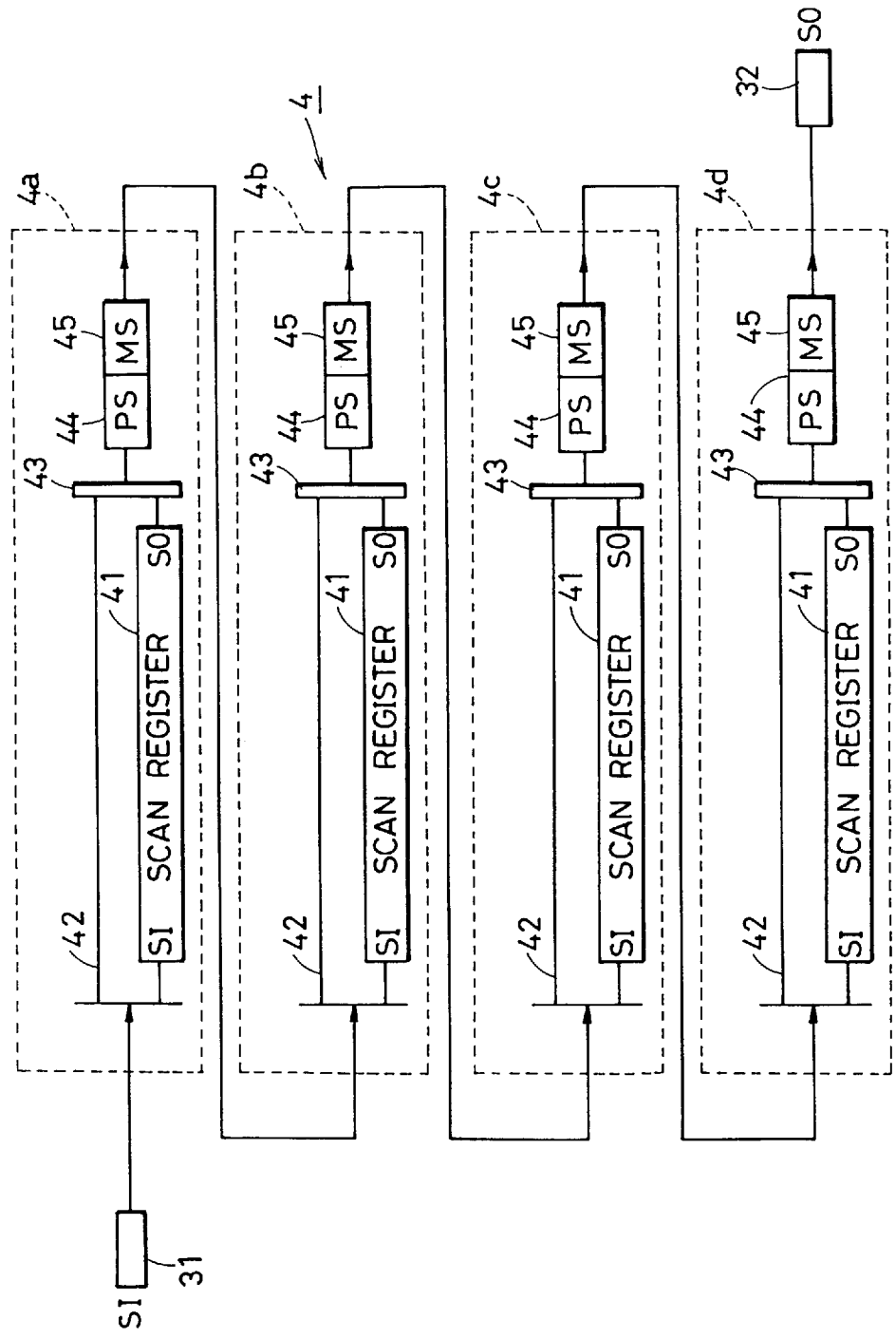
FIG. 13 is a block diagram showing a scan path of the integrated circuit device shown in FIG. 12.
Figure 14:
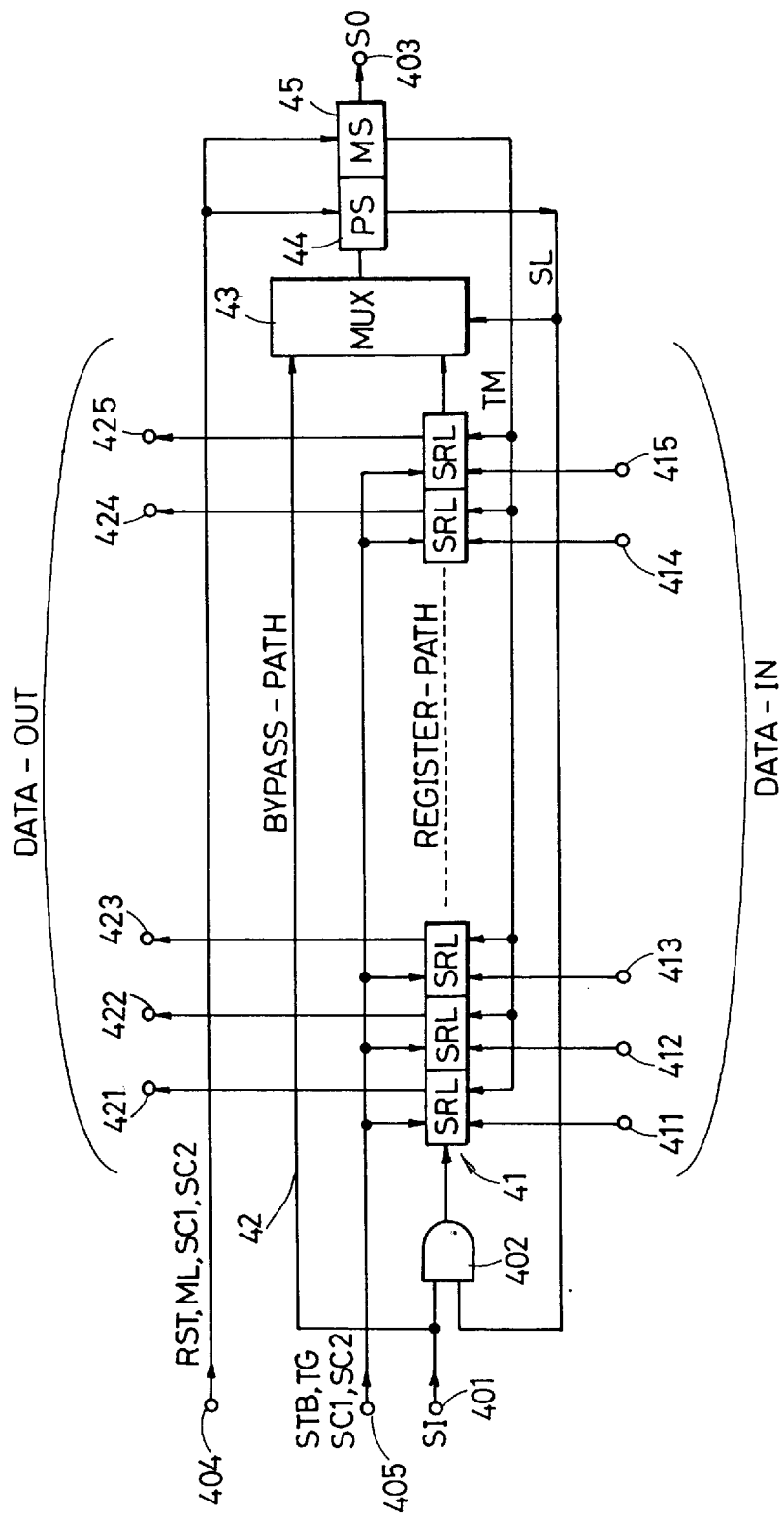
FIG. 14 is a block diagram showing a more detailed structure of the bypass scan path of FIG. 13.
Figure 15:
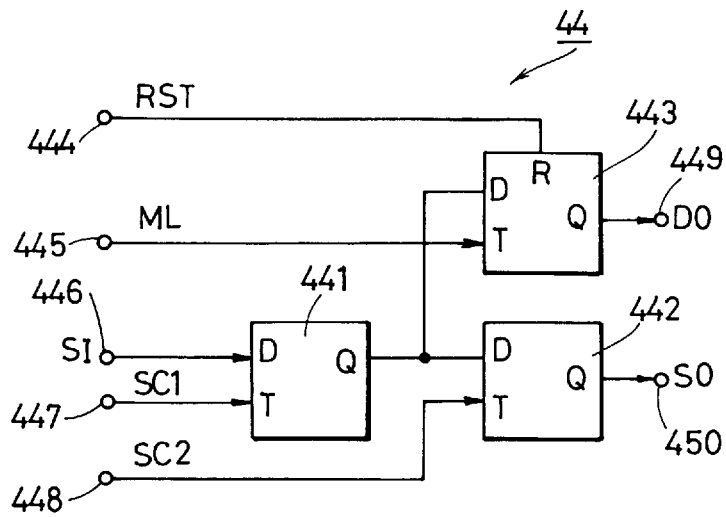
FIG. 15 is a block diagram showing a more detailed structure of a selection data holding register of FIG. 14.

As an example, the following is the comparison in a test time required for a test of an integrated circuit device having such a scan architecture as shown in FIG. 12, between a case where the device uses the conventional scan path as shown in FIG. 13 and a case where the device uses the scan path according to one embodiment of the present invention shown in FIG. 1.

It is assumed in FIGS. 1 and 13 that bypass scan paths 4a–4d have a-bit, b-bit, c-bit and d-bit scan registers 41, respectively. It is also assumed that each of selection data propagation holding register 44 and mode data propagation holding register 45 has one bit.

Consideration will be give to a test of, for example, function module 11 under such conditions as described above, with the number of patterns of test data to be applied to function module 11 being as A.

A number of cycles required for a scan path according to the embodiment shown in FIG. 1 and a number of cycles required for the conventional scan path shown in FIG. 13 will be described in the following for each processing executed in a test operation.

[1] Operation in selection mode (a) Reset

Selection data propagation holding register 44 of each of bypass scan paths 4a and 4b is reset in response to reset signal RST. As a result, each of bypass scan paths 4a–4d selects a bypass path. This reset operation requires one cycle for both of the scan path according to the embodiment shown in FIG. 1 and the conventional scan path shown in FIG. 13.

(b) Selection data shift-in

Selection data and mode data are serially input. The input selection data is propagated on the bypass path in each of bypass scan paths 4a–4d. This operation requires (the number of bits of selection data propagation holding register+the number of bits of mode data propagation holding register)×the number of bypass scan paths=(1+1)×4=8 for both the scan path according to the embodiment shown in FIG. 1 and the conventional scan path shown in FIG. 13.

(c) Setting of selection data

Selection data is set in selection data propagation holding register 44 and mode data is set in mode data propagation holding register 45 in each of bypass scan paths 4a–4d in response to mode latch signal ML. As a result, bypass scan paths 4a–4c select the register paths, while bypass scan path 4d selects the bypass path. The selection data and mode data setting operation requires one cycle for both the scan path according to the embodiment shown in FIG. 1 and the conventional scan path shown in FIG. 13.

[2] Operation in test mode (a) Test data shift-in

Test data is serially input. At this time, a register path is selected in each of bypass scan paths 4a–4c both in the scan path according to the embodiment shown in FIG. 1 and the conventional scan path shown in FIG. 13, while a bypass path is selected in bypass scan path 4d. The respective bypass scan paths propagate test data by the selected paths. Since shift-in of in the test data is carried out for each of A types of test pattern, the scan path according to the embodiment shown in FIG. 1 requires (a+b+c+2)×A cycles. The conventional scan path shown in FIG. 13 requires {a+b+c+(2×3)+2}×A cycles.

(b) Application and capture of test data

Test data held by each SRL in bypass scan path 4a is applied to control points of function module 11 and test result data output from observation points of function module 11 are captured by each SRL of bypass scan paths 4b and 4c. Both of the scan path according to the embodiment shown in FIG. 1 and the conventional scan path shown in FIG. 13 require 1×A cycles for the application and the capture of the test data.

(c) Test result data shift-out

The test result data captured by each SRL of bypass scan paths 4b and 4c is sequentially shifted and output. At this time, a register path is selected in each of bypass scan paths 4a–4c and a bypass path is selected in bypass scan path 4d in both of the scan path according to the embodiment shown in FIG. 1 and the conventional scan path shown in FIG. 3. The test result data shift-out operation therefore requires the same number of cycles as that of the above-described test data shift-in. In other words, the scan path according to the embodiment shown in FIG. 1 requires (a+b+c+2)×A cycles, while the conventional scan path shown in FIG. 13 requires [a+b+c+(2×3)+2]×A cycles.

The number of cycles required for a test of function module 11 is as follows.

FIG. 1 (embodiment): 10+(a+b+c+2)×A×2+A

FIG. 13 (conventional art): 10+{a+b+c+(2×3)+2}×A× 2+A The difference therebetween is (2×3)×A×2 cycles.

In general, there are numerous test patterns for testing a function module and the same test procedure is executed for other function modules. Such difference in the number of cycles greatly reduces a test time period.

In addition, the difference between the scan path according to the embodiment shown in FIG. 1 and the conventional scan path shown in FIG. 13 in the number of cycles required for a test is that (the number of bits of a selection data propagation holding register+the number of bits of a mode data propagation holding register)×the number of bypass scan paths selecting a register path×the number of test patterns×2×the number of function modules, the factor of which is increased as the integrated circuit device is made larger in scale and more complicated. Therefore, the larger and more complicated the integrated circuit device is made, the more effect in reduction of a test time period is produced.

Furthermore, the structure of the scan path according to the embodiment shown in FIG. 1 including the same necessary circuit elements as those of the conventional scan path shown in FIG. 13 produces an effect in reducing a test time period without increasing the circuit area.

Figure 3:
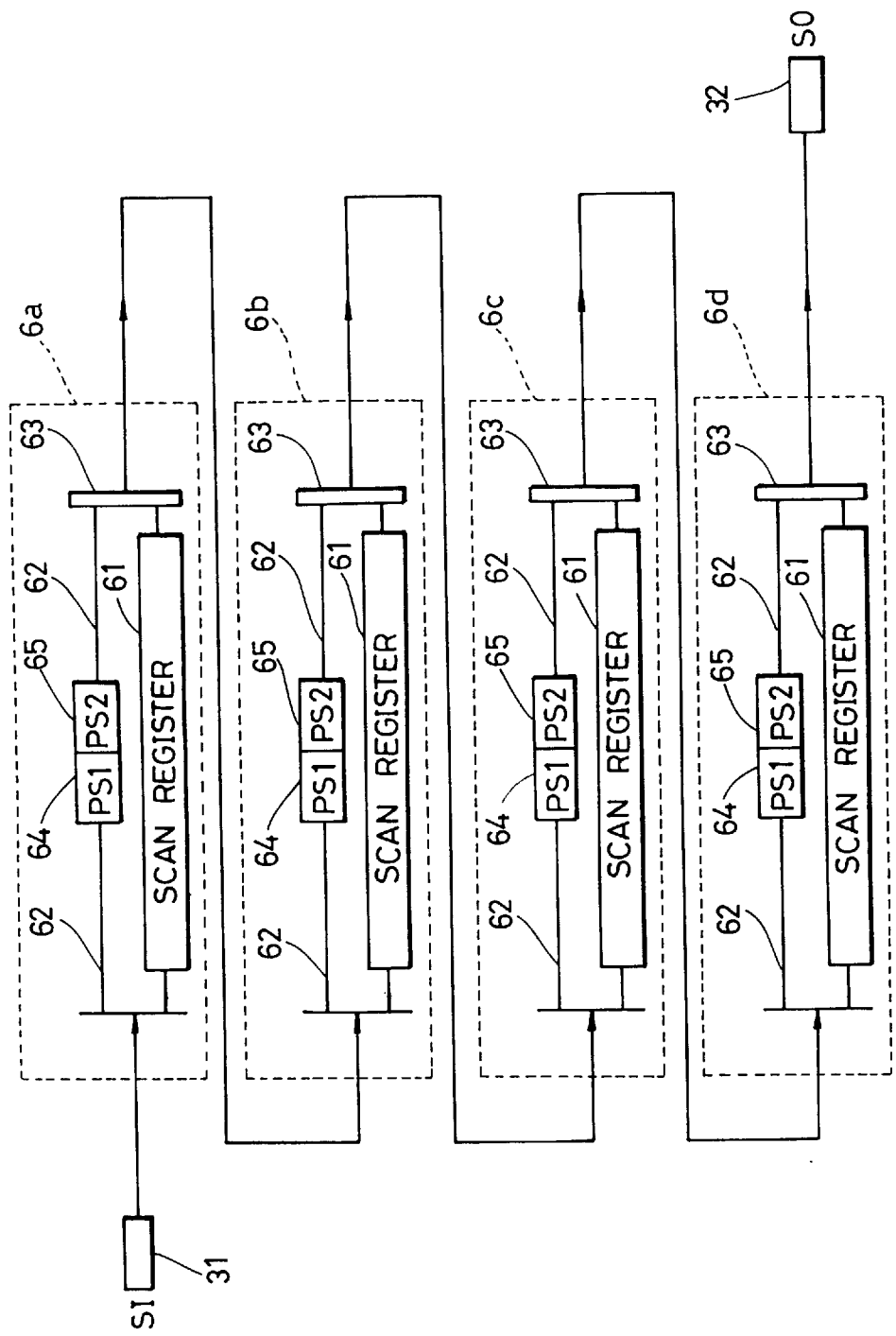
FIG. 3 is a block diagram showing a structure of a scan path according to a second embodiment of the present invention.

FIG. 3 is a block diagram showing the structure of a scan path according to a second embodiment of the present invention. In the drawing, bypass scan paths 6a–6d are connected in series between SI terminal 31 and SO terminal 32 to form a serial data propagation path. Each bypass scan path includes a scan register 61, a bypass line 62, a MUX 63 and selection data propagation registers 64 and 65. Selection data propagation registers 64 and 65 are provided on a bypass path constituted by bypass line 62.

Figure 4:
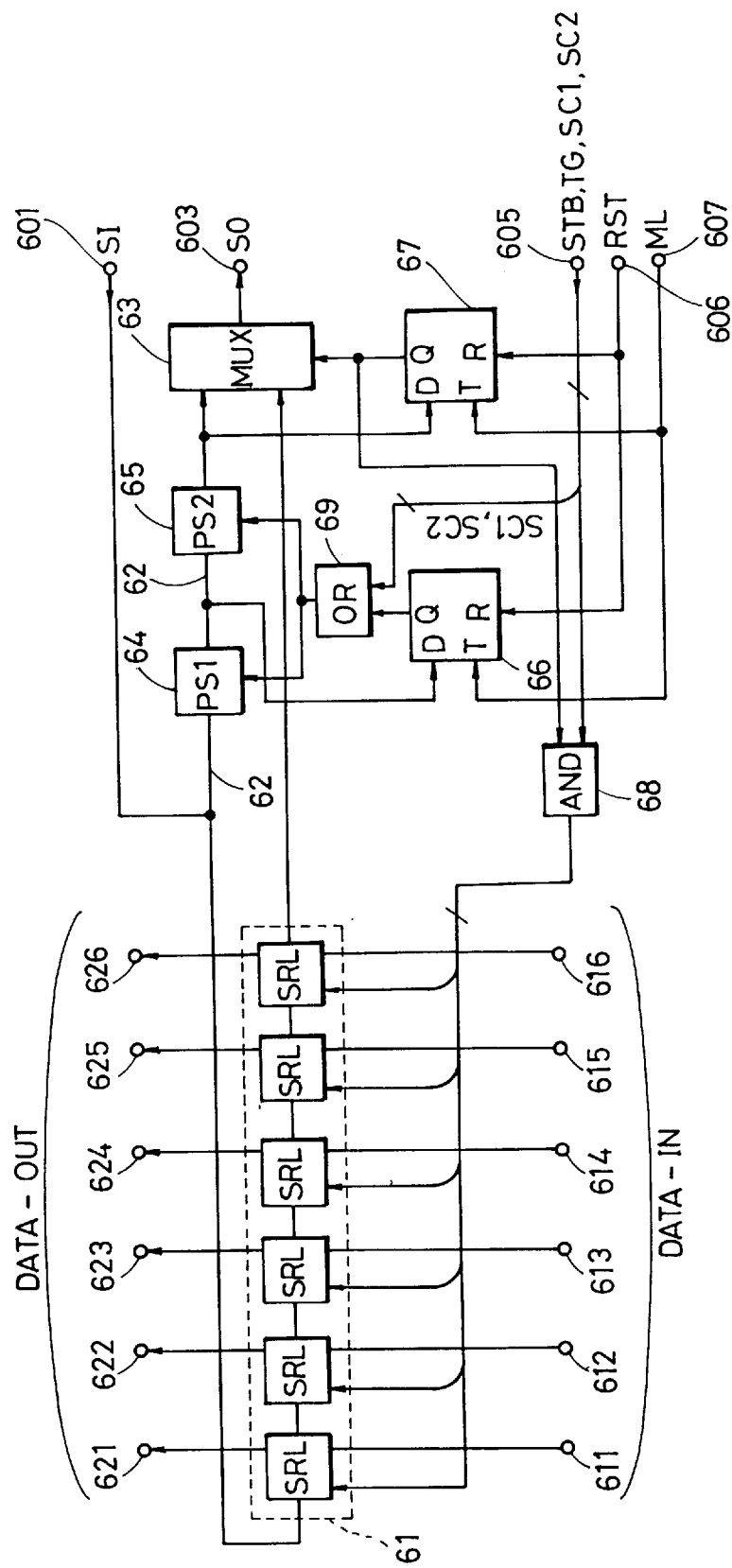
FIG. 4 is a block diagram showing a more detailed structure of the bypass scan path of FIG. 3.

FIG. 4 is a block diagram showing a more detailed structure of the bypass scan path shown in FIG. 3. In the drawing, scan register 61 is structured by a serial connection of a plurality of SRL. The respective SRL are connected to observation points of a corresponding function module or the system data input terminal of the integrated circuit device through input terminals 611–616. The respective SRL are also connected to control points of the corresponding function module or the system data output terminal of the integrated circuit device through output terminals 621–626. Data serially input from an SI terminal 601 (selection data or test data) is applied to an SI terminal of the first stage SRL in scan register 61 and it is also applied to an SI terminal of selection data propagation register 64 through bypass line 62. An SO terminal of selection data propagation register 64 is connected to an SI terminal of selection data propagation register 65 and an SO terminal of selection data propagation register 65 is connected to one input end of MUX 63. An SO terminal of the last stage SRL in scan register 61 is connected to the other input end of MUX 63.

The output of selection data propagation register 64 is further applied to a data terminal D of a latch circuit 66. The output of selection data propagation register 65 is further applied to a data terminal D of a latch circuit 67. Respective reset terminals R of latch circuits 66 and 67 receive a reset signal RST from an input terminal 606. Respective trigger terminals T of latch circuits 66 and 67 receive a mode latch signal ML from an input terminal 607. An output signal of an output terminal Q of latch circuit 66 is applied to an OR circuit 69. OR circuit 69 receive shift clock signals SC1 and SC2 from an input terminal 605. The output of OR circuit 69 is applied to selection data propagation registers 64 and 65. An output signal of an output terminal Q of latch circuit 67 is applied to MUX 63 as a selection control signal and it is also applied to an AND circuit 68. AND circuit 68 receives a strobe signal STB, a timing signal TG and shift clock signals SC1 and SC2 from input terminal 605. The output of AND circuit 68 is applied to each SRL in scan register 61. MUX 63 selects the output of scan register 61 or the output of selection data propagation register 65 in response to the selection control signal from latch circuit 67 and outputs the selected output to an SO terminal 603.

Figure 5:
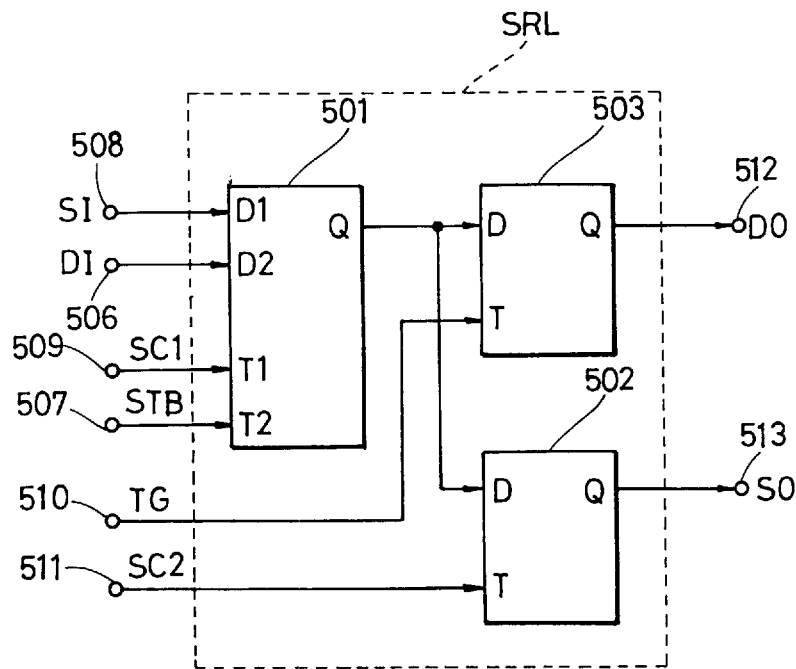
FIG. 5 is a block diagram showing a more detailed structure of SRL of FIG. 4.

FIG. 5 is a block diagram showing a more detailed structure of SRL of FIG. 4. Schematically, the SRL shown in FIG. 5 has the same structure as the SRL shown in FIG. 16 with selector 504 eliminated therefrom. A first data terminal D1 of a latch circuit 501 receives serial data from an SI terminal 508 and a second data terminal D2 receives system data or test result data from a DI terminal 506. A first trigger terminal T1 of latch circuit 501 receives a shift clock signal SC1 from an input terminal 509 and a second trigger terminal T2 receives a strobe signal STB from an input terminal 507. The output signal of an output terminal Q of latch circuit 501 is applied to respective data terminals D of latch circuits 502 and 503. A trigger terminal T of latch circuit 502 receives a shift clock signal SC2 from an input terminal 511. A trigger terminal T of latch circuit 503 receives a timing signal TG from an input terminal 510. The output signal of an output terminal Q of latch circuit 502 is applied to an SO terminal 513. The output signal of an output terminal Q of latch circuit 503 is applied to a DO terminal 512.

SI terminal 508 is connected to SI terminal 601 of FIG. 4 or SO terminal 513 of the preceding stage SRL. SO terminal 513 is connected to an SI terminal 508 in the subsequent stage SRL or the input end of MUX 63 of FIG. 4. Each DI terminal 506 is connected to one of input terminals 611–616 of FIG. 4. Each DO terminal 512 is connected to one of output terminals 621–626 of FIG. 4. Input terminals 507, 509, 510 and 511 are connected to the output end of AND circuit 68 of FIG. 4.

Latch circuits 501 and 502 shown in FIG. 5, having trigger terminals T1 and T2 receiving shift clock signals SC1 and SC2, respectively, constitute a shift register for data propagation between SI terminal 508 and SO terminal 513. Latch circuit 501 latches the test result data applied from DI terminal 506 in response to strobe signal STB applied from input terminal 507. Latch circuit 503 latches the test data latched by latch circuit 501 and outputs the data to DO terminal 512 in response to timing signal TG applied from input terminal 510.

Figure 6:
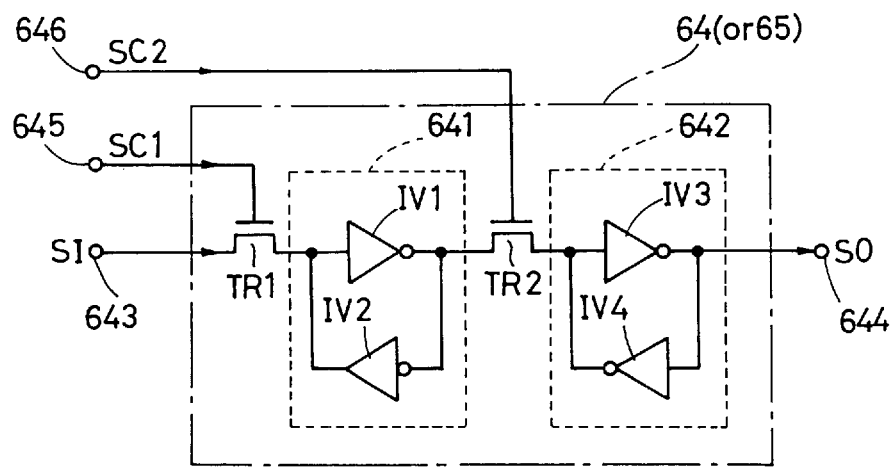
FIG. 6 is a circuit diagram showing a more detailed structure of a selection data propagation register of FIG. 4.

FIG. 6 is a circuit diagram showing a more detailed structure of selection data propagation register 64 shown in FIG. 4. In the drawing, selection data propagation register 64 includes N channel type MOS transistors TR1 and TR2 and inverters IV1–IV4. Inverters IV1 and IV2 connected in anti-parallel to each other constitute a so-called ratio type latch circuit 641. Similarly, inverters IV3 and IV4 connected in anti-parallel to each other constitute so-called ratio type latch circuit 642. Transistor TR1 is provided between an SI terminal 643 and latch circuit 641. The gate of transistor TR1 receives a shift clock signal SC1 from an input terminal 645. Transistor TR2 is provided between latch circuits 641 and 642. The gate of transistor 642 receives a shift clock signal SC2 from an input terminal 646. The output signal of latch circuit 642 is applied to an SO terminal 644.

SI terminal 643 is connected to SI terminal 601 through bypass line 62 of FIG. 4. Input terminals 645 and 646 are connected to the output end of OR circuit 69.

Selection data propagation register 65 shown in FIG. 4 has the same structure as that of selection data propagation register 64 shown in FIG. 6. SI terminal 643 of selection data propagation register 65 is connected to SO terminal 644 of selection data propagation register 64. SO terminal 644 of selection data propagation register 65 is connected to the input end of MUX 63 and to data input terminal D of latch circuit 67.

Figure 7:
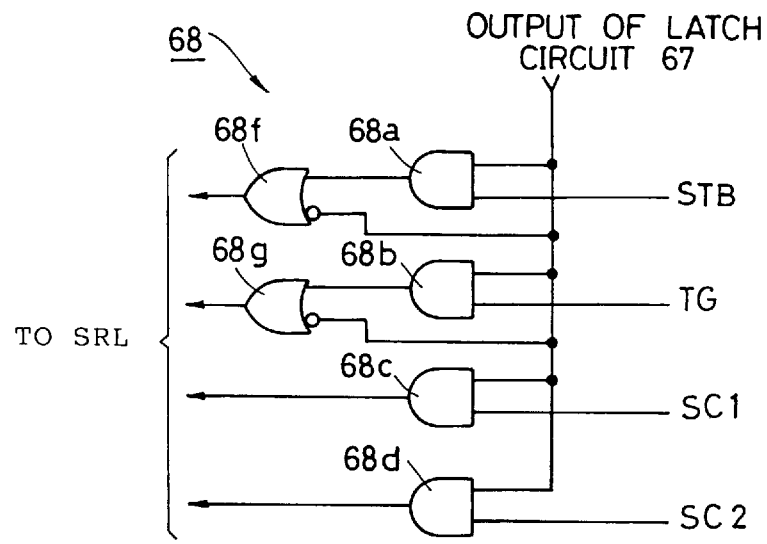
FIG. 7 is a logic gate diagram showing a more detailed structure of an AND circuit 68 of FIG. 4.

FIG. 7 is a logic gate diagram showing a more detailed structure of AND circuit 68 shown in FIG. 4. In the drawing, AND circuit 68 includes four AND gates 68a–68d and two OR gates 68f and 68g. AND gate 68a outputs a logical product of the output of latch circuit 67 and strobe signal STB. AND gate 68b outputs a logical product of the output of latch circuit 67 and timing signal TG. AND gate 68c outputs a logical product of the output of latch circuit 67 and shift clock signal SC1. AND gate 68d outputs a logical product of the output of latch circuit 67 and shift clock signal SC2. The outputs of AND gates 68a and 68b are applied to OR gates 68f and 68g, respectively. OR gates 68f and 68g receive inversion of the output signal of latch circuit 67. The outputs of OR gates 68f and 68g, respectively and AND gates 68c and 68d are applied to the respective SRL of FIG. 4.

Figure 8:
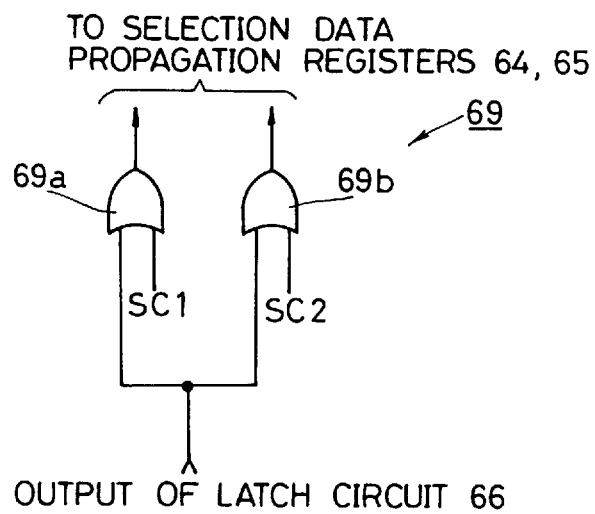
FIG. 8 is a logic gate diagram showing a more detailed structure of an OR circuit 69 of FIG. 4.

FIG. 8 is a logic gate diagram showing a more detailed structure of OR circuit 69 shown in FIG. 4. In the drawing, OR circuit 69 includes two OR gates 69a and 69b. OR gate 69a outputs a logical sum of the output signal of latch circuit 66 and shift clock signal SC1. OR gate 69b outputs a logical sum of the output signal of latch circuit 66 and shift clock signal SC2.

Operation of the scan path shown in FIGS. 3 and 4 will be described in the following.

(1) Normal operation

In a normal operation, reset signal RST is brought to a high level to reset latch circuits 66 and 67. As a result, the output signal of latch circuit 67 is pulled down to a low level. In AND circuit 68, strobe signal STB output from OR gate 68f and timing signal TG output from OR gate 68g are fixed to a high level, while shift clock signal SC1 output from AND gate 68c and shift clock signal SC2 output from AND gate 68d are fixed to a low level in response to the output signal of latch circuit 67 being at a low level. In each SRL in scan register 61, therefore, latch circuits 501 and 503 simply operate as a driver to form a propagation path of system data between DI terminal 506 and DO terminal 512.

(2) Test operation

[1] Operation in selection mode (a) Reset

Reset signal RST is brought to a high level to reset latch circuits 66 and 67. As a result, the output signal of latch circuit 67 attains a low level, whereby MUX 63 selects the output signal of selection data propagation register 65, that is, a bypass path. With the output signal of latch circuit 66 being at a low level, shift clock signals SC1 and SC2 input from input terminal 605 are applied to selection data propagation registers 64 and 65 through OR circuit 69.

The above-described operation is similarly performed in each of bypass scan paths 6a–6d. In other words, all the bypass scan paths 6a–6d select a bypass path.

(b) Selection data shift-in

Selection data is serially input from SI terminal 31 of FIG. 3. The input selection data is propagated on the bypass in each of bypass scan paths 6a–6d. At this time, selection data propagation registers 64 and 65 in each bypass scan path shifts the selection data in synchronization with shift clock signals SC1 and SC2.

(c) Setting of selection data

When the input selection data is shifted to a predetermined position, mode latch signal ML is brought to a high level. In response to the mode latch signal ML, latch circuit 66 latches selection data output from selection data propagation register 64, while latch circuit 67 latches selection data output from selection data propagation register 65.

When a register path in a test mode is selected which will be described later, latch circuit 66 latches low level or high level selection data, while latch circuit 67 latches high level selection data. When in selecting a bypass path in a test mode, latch circuit 66 latches high level selection data, while latch circuit 67 latches low level selection data.

When latch circuits 66 and 67 latch selection data for register path selection, the output signal of latch circuit 67 attains a high level. MUX 63 consequently selects the output signal of scan register 61. AND circuit 68 propagates strobe signal STB, timing signal TG and shift clock signals SC1 and SC2 applied from input terminal 605 to each SRL, thereby causing scan register 61 to be ready for data propagation.

When latch circuits 66 and 67 latch selection data for bypass path selection, the output signal of latch circuit 67 attains a low level. MUX 63 consequently selects the output signal of selection data propagation register 65. AND circuit 68 is not allowed to propagate strobe signal STB, timing signal TG and shift clock signals SC1 and SC2 applied from input terminal 605 to each SRL. Scan register 61 is caused to enter a data propagation disabled state as a result. In response to the output signal of latch circuit 66 attaining a high level, OR circuit 69 fixes shift clock signals SC1 and SC2 applied to selection data propagation registers 64 and 65 at a high level. As a result, transistors TR1 and TR2 turn on at all times to enable data to be through between SI terminal 643 and SO terminal 644 in selection data propagation registers 64 and 65 of FIG. 6. That is, selection data propagation registers 64 and 65 render input data through without a shifting operation.

[2] Operation in test mode (a) Test data shift-in

Test data is serially input from SI terminal 31 of FIG. 3. The input test data is sequentially propagated through bypass scan paths 6a–6d. At this time, when some bypass scan path selects a register path, the test data input from SI terminal 601 is shifted by each SRL of scan register 61 and output from MUX 63 to SO terminal 603. When some bypass scan path selects a bypass path, the test data input from SI terminal 601 passes through selection data propagation registers 64 and 65 to be output from MUX 63 to SO terminal 603. At this time, since selection data propagation registers 64 and 65 do not perform a shifting operation, a bit length of a data propagation path at the time of test data propagation becomes shorter than that in the embodiment shown in FIGS. 1 and 2. The embodiment shown in FIGS. 3 and 4 therefore enables shift-in of test data in a short time period.

(b) Application and capture of test data

Timing signal TG is brought to a high level after finishing the shift-in of test data. As a result, latch circuit 503 in each SRL captures and latches test data held by latch circuit 501 in scan register 61 in which test data is set. The test data latched by latch circuit 503 is applied to control points of the corresponding function module through DO-terminal 512.

Then, strobe signal STB is brought to a high level. As a result, latch circuit 501 captures and latches test result data output from the corresponding function module through DI terminal 506 in a SRL which is in a bypass scan path selecting a register path and is connected to the observation point of the function module.

(c) Test result data shift-out

The test result data held by a predetermined SRL is shifted in synchronization with non-overlapping two-phase shift clock signals SC1 and SC2 and externally output from SO terminal 32 in a serial manner. At this time, in a bypass scan path selecting a bypass path, the test result data input from SI terminal 601 is output from MUX 63 to SO terminal 603 after passing through selection data propagation registers 64 and 65. As in the shift-in of test data, with selection data propagation registers 64 and 65 not performing a shifting operation, a bit length of a data propagation path becomes shorter than that in the embodiment shown in FIGS. 1 and 2, resulting in a further reduction in a shift-out time period for test result data.

Figure 9:
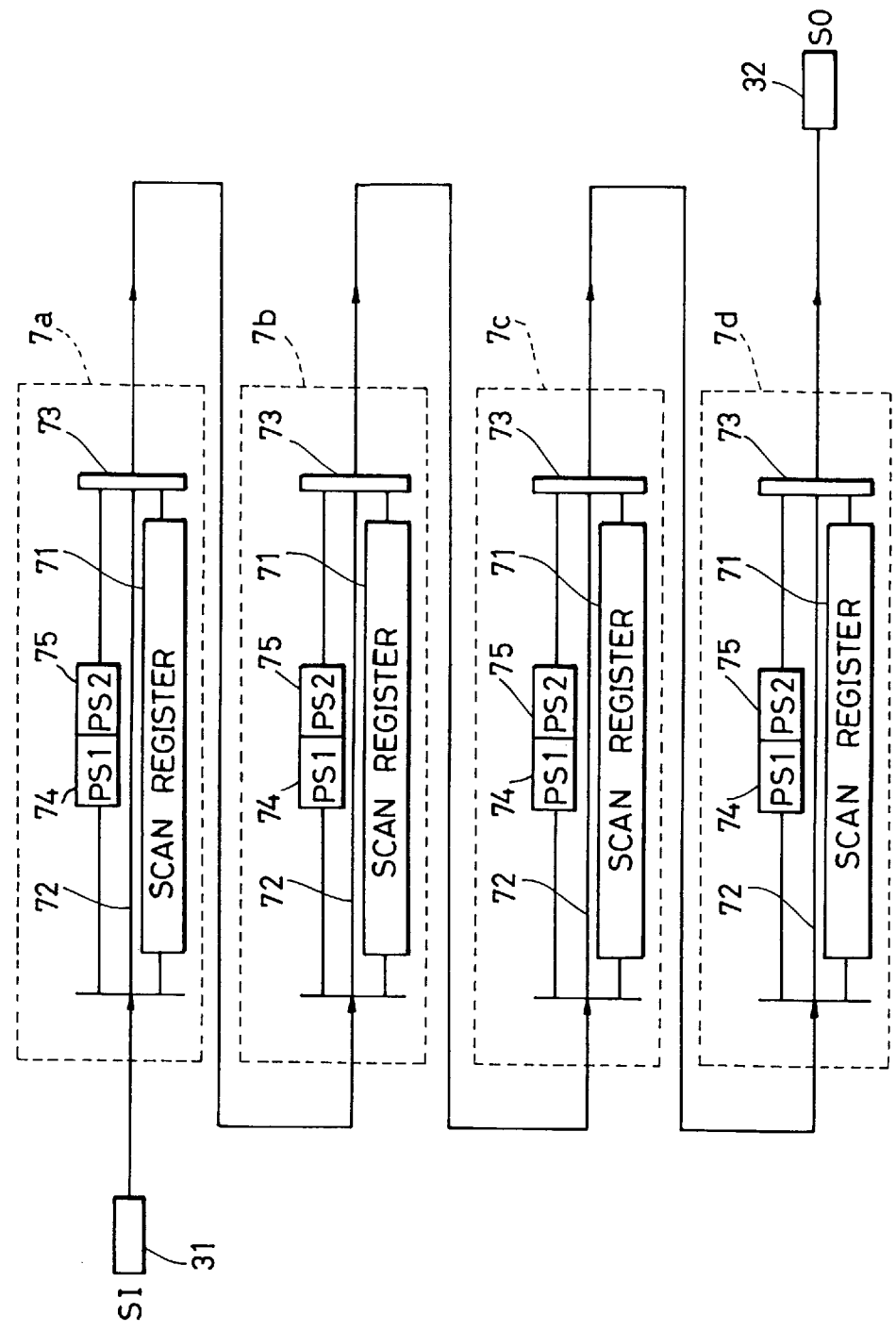
FIG. 9 is a block diagram showing a structure of a scan path according to a third embodiment of the present invention.

FIG. 9 is a block diagram showing a structure of a scan path according to a third embodiment of the present invention. In the drawing, a plurality of bypass scan paths 7a–7d are connected in series between SI terminal 31 and SO terminal 32 to form a serial data propagation path. Each of bypass scan paths 7a–7d includes a scan register 71, a bypass line 72, a MUX 73 and selection data propagation registers 74 and 75. The scan path shown in FIG. 9 differs from that shown in FIG. 3 in that selection data propagation registers 74 and 75 are provided in parallel to scan register 71 and bypass line 72. In other words, selection data propagation registers 74 and 75 form an independent selection data propagation path of scan register 71 and bypass line 72.

Figure 10:
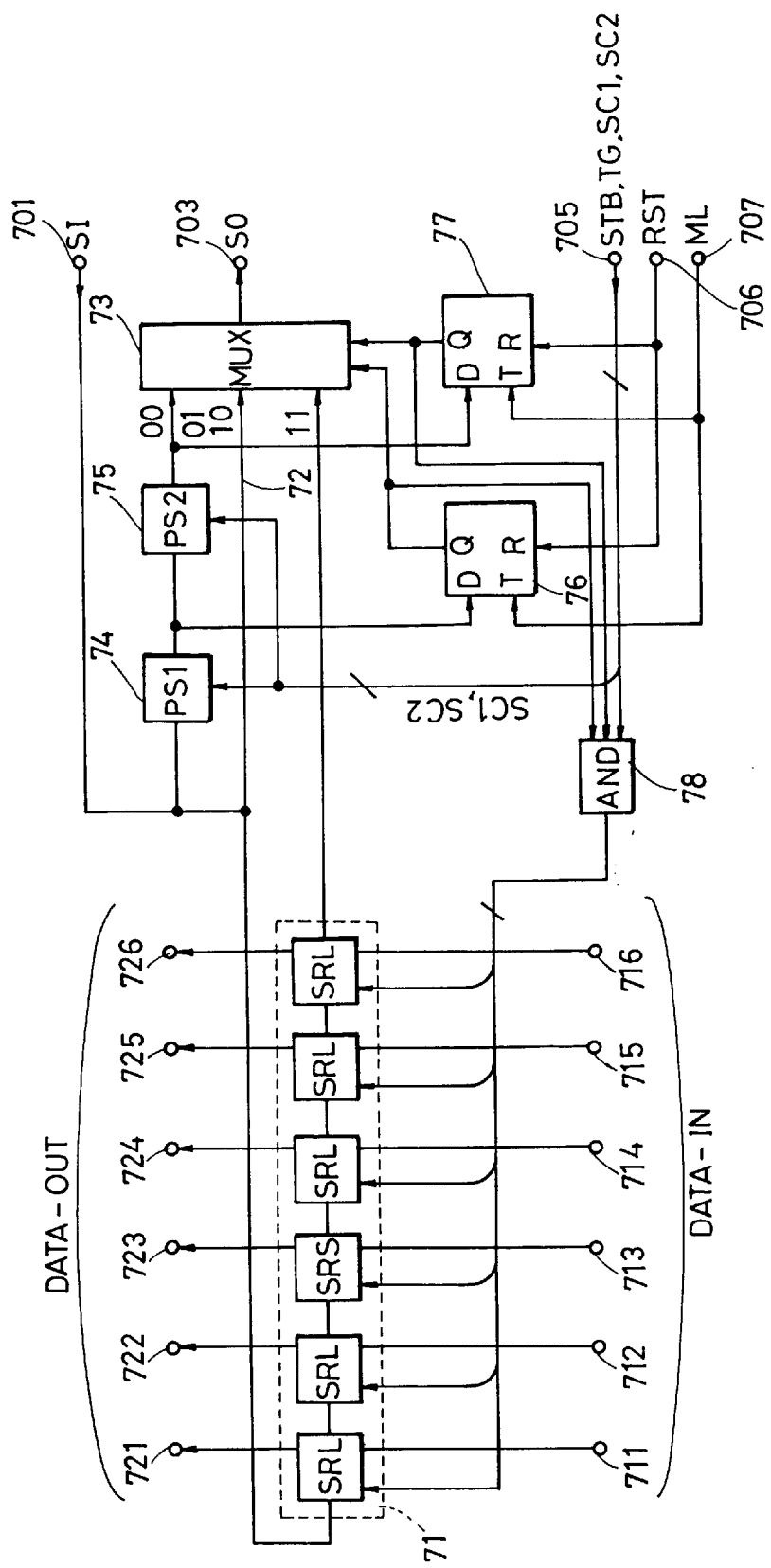
FIG. 10 is a block diagram showing a more detailed structure of the bypass scan path of FIG. 9.

FIG. 10 is a block diagram showing a more detailed structure of the bypass scan path shown in FIG. 9. In the drawing, scan register 71 is constituted by a serial connection of a plurality of SRL. Each SRL has the same structure as that of SRL shown in FIG. 5. The respective SRL are connected to the observation points of the corresponding function module through input terminals 711–716. The respective SRL are also connected to the control points of the corresponding function module through output terminals 721–726. Scan register 71 is provided between an SI terminal 701 and the input end of MUX 73. Bypass line 72 is provided between SI terminal 701 and the input end of MUX 73. Selection data propagation registers 74 and 75 are provided between SI terminal 701 and the input end of MUX 73. Selection data propagation registers 74 and 75 have the same structure as that of the selection data propagation registers shown in FIG. 6.

The output signal of selection data propagation register 74 is applied to a data terminal D of a latch circuit 76. The output signal of selection data propagation register 75 is applied to a data terminal D of a latch circuit 77. Respective trigger terminals T of latch circuit 76 and 77 receive a mode latch signal ML through an input terminal 707. Reset terminals R of latch circuits 76 and 77 receive a reset signal RST through an input terminal 706. The output signal of an output terminal Q of latch circuit 76 is applied to MUX 73 and an AND circuit 78. The output signal of an output terminal Q of latch circuit 77 is applied to MUX 73 and to AND circuit 78. MUX 73 selects one of the register path, the bypass path and selection data propagation path in response to the output signals of latch circuits 76 and 77. The output signal of MUX 73 is applied to an SO terminal 703. AND circuit 78 receives a strobe signal STB, a timing signal TG and shift clock signals SC1 and SC2 from an input terminal 705. Selection data propagation registers 74 and 75 receive the shift clock signals SC1 and SC2 from input terminal 705. The output of AND circuit 78 is applied to each SRL of scan register 71.

Figure 11:
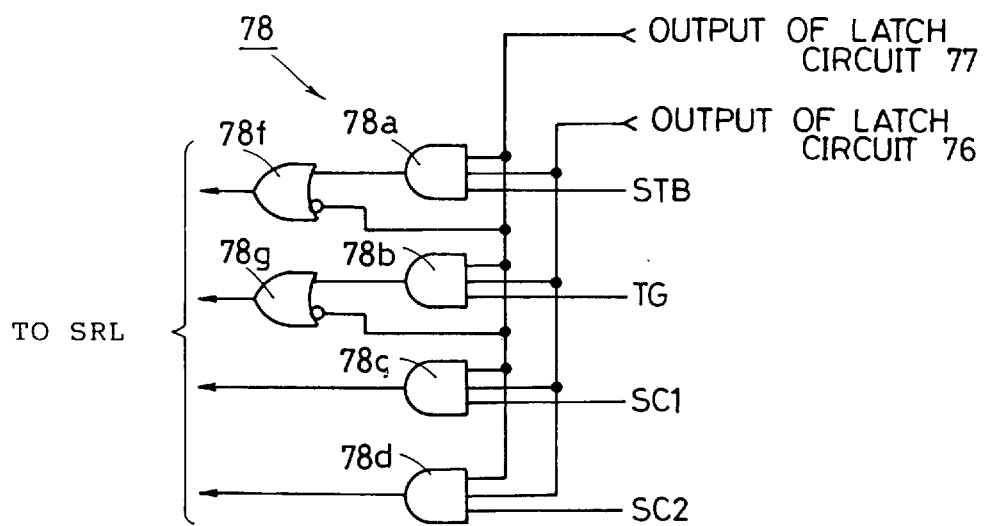
FIG. 11 is a logic gate diagram showing a more detailed structure of an AND circuit 78 of FIG. 10.

FIG. 11 is a logic gate diagram showing a more detailed structure of AND circuit 78 shown in FIG. 10. In the drawing, AND circuit 78 includes four AND gates 78a–78d and two OR gates 78f and 78g. AND gate 78a outputs a logical product of the output signals of latch circuits 76 and 77 and strobe signal STB. AND gate 78b outputs a logical product of the output signals of latch circuits 76 and 77 and a timing signal TG. AND gate 78c outputs a logical product of the output signals of latch circuits 76 and 77 and the shift clock signal SC1. AND gate 78d outputs a logical product of the output signals of latch circuits 76 and 77 and the shift clock signal SC2. The outputs of AND gates 78a and 78b are applied to OR gates 78f and 78g, respectively. OR gates 78f and 78g receive an inversion of the output signal of latch circuit 77. The outputs of OR gates 78f and 78g and the outputs of AND gates 78c and 78d are applied to the respective SRL in scan register 71.

Operation in the embodiment shown in FIGS. 9 and 10 will be described.

(1) Normal operation

In a normal operation, reset signal RST is brought to a high level to reset latch circuits 76 and 77. The output signals of latch circuits 76 and 77 consequently attain a low level. As a result, the output signals of OR gates 78f and 78g in AND circuit 78 are fixed to a high level, while the output signals of AND gates 78c and 78d are fixed to a low level. In other words, each SRL in scan register 71 receives high level strobe signal STB and timing signal TG and low level shift clock signals SC1 and SC2. In each SRL, therefore, latch circuits 501 and 503 simply operate as a driver to enable the data to be through between DI terminal 506 and DO terminal 512. Each SRL propagates system data input from DI terminal 506 to DO terminal 512.

The above-described operation is similarly performed in all of the bypass scan paths 7a–7d.

(2) Test operation

[1] Operation in selection mode (a) Reset

Reset signal RST is brought to a high level to reset latch circuits 76 and 77. The output signals of latch circuits 76 and 77 both attain a low level as a result. MUX 73 selects the output signal of selection data propagation register 75, that is, the selection data propagation path when both of the output signals of latch circuits 76 and 77 are at a low level.

The above-described operation is similarly performed in all of the bypass scan paths 4a–4d. As a result, the selection data propagation path is selected in all of the bypass scan paths 4a–4d.

(b) Selection data shift-in

Selection data is serially input from SI terminal 31 of FIG. 9. The input selection data is propagated on the selection data propagation path in each of bypass scan paths 7a–7d. At this time, selection data propagation registers 74 and 75 receive non-overlapping two-phase shift clock signals SC1 and SC2 and shift the input selection data.

(c) Setting of selection data

When the input selection data is shifted to a predetermined position of a scan path, mode latch signal ML is brought to a high level. In response to the mode latch signal ML, latch circuit 76 latches the selection data output from selection data propagation register 74. Latch circuit 77 latches the selection data output from selection data propagation register 75. When a register path is selected in a test mode which will be described later, latch circuits 76 and 77 both latch high level selection data. When a bypass path is selected in the test mode which will be described later, latch circuits 76 and 77 latch complementary selection data. In other words, when latch circuit 76 latches high level selection data, latch circuit 77 latches low level selection data. When latch circuit 76 latches low level selection data, latch circuit 77 latches high level selection data.

When both of latch circuits 76 and 77 latch high level selection data, MUX 73 selects an output signal of scan register 71, that is, a register path. AND circuit 78 transmits strobe signal STB, timing signal TG and shift clock signals SC1 and SC2 applied from input terminal 705 to the respective SRL in scan register 71. When latch circuit 76 latches high level (or low level) selection data and latch circuit 77 latches low level (or high level) selection data, MUX 73 selects bypass line 72, that is, the bypass path. At this time, AND circuit 78 does not transmit strobe signal STB, timing signal TG and shift clock signals SC1 and SC2 applied from input terminal 705 to the respective SRL in scan register 71. Scan register 71 is disabled to propagate data as a result.

[2] Operation in test mode (a) Test data shift-in

Test data is serially input from SI terminal 31 of FIG. 9. The input test data is propagated through bypass scan paths 7a–7d in turn. At this time, in a bypass scan path selecting a register path, the test data input from SI terminal 701 is shifted by each SRL in scan register 71 and output from MUX 73 to SO terminal 703. On the other hand, the test data input from SI terminal 701 is output from MUX 73 to SO terminal 703 through bypass line 72 in a bypass scan path selecting a bypass path.

As described in the foregoing, input test data is output to SO terminal 703 through bypass line 72 in a bypass scan path selecting a bypass path. A bit length of a test data propagation path is therefore shorter than that in the embodiment shown in FIGS. 1 and 2 with selection data propagation holding register 44 and mode data propagation holding register 45 provided on the bypass line, leading to a reduction in a time period required for shifting in test data.

(b) Application and capture of test data

After finishing the shift-in of test data, timing signal TG is brought to a high level. In a bypass scan path selecting a register path, latch circuit 503 in each SRL in scan register 71 latches the selection data held by latch circuit 501 to output the data from DO terminal 512 to control points of the corresponding function module. In a bypass scan path selecting a bypass path, AND circuit 78 prevents transmission of strobe signal STB, timing signal TG and shift clock signals SC1 and SC2 to each SRL, thereby preventing the SRL-from operating.

When the application of the test data to the control points of the function module is finished, strobe signal STB is brought to a high level. In response thereto, in a bypass scan path selecting a register path, latch circuit 501 of each SRL in scan register 71 latches test result data from the corresponding function module which data is applied through DI terminal 506. In a bypass scan path selecting a bypass path, AND circuit 78 prevents transmission of strobe signal STB, timing signal TG and shift clock signals SC1 and SC2 to each SRL, thereby preventing the SRL from operating.

(c) Test result data shift-out

When the capture of the test result data by a predetermined SRL is finished, non-overlapping two-phase shift clock signals SC1 and SC2 are applied to the respective bypass scan paths 7a–7d. As a result, in a bypass scan path selecting a register path, the test result data held by each SRL is sequentially shifted and output from MUX 73 to SO terminal 703. In a bypass scan path selecting a bypass path, the test result data input from SI terminal 701 is output from MUX 73 to SO terminal 703 through bypass line 72. Thus propagated test result data is externally output from SO terminal 32 in a serial manner.

As described in the foregoing, test result data is output to SO terminal 703 through bypass line 72 in a bypass scan path selecting a bypass path. Therefore, a bit length of a test result data propagation path is shorter than that in the embodiment shown in FIGS. 1 and 2 with selection data propagation holding register 44 and mode data propagation holding register 45 provided on a bypass path, leading to a more rapid shift-out of test result data.

Although the above-described embodiments are structured as a scan path for use in testing the inner part of an integrated circuit device, the present invention is applicable to other usage than testing. For example, the scan path can be structured such that data (for example, system data) other than test data is propagated and applied to control points in an integrated circuit device and some data is captured at observation points, shifted and externally output.

The number of bypass scan paths provided between SI terminal 31 and SO terminal 32 and the number of SRL which a scan register of each bypass scan path has are not limited to those according to the above-described embodiments and any numbers can be used.

As described above, the present invention can obtain an excellent bypass scan path requiring a short data propagation time without increasing a chip area due to the concentration of the wirings and without increasing the number of pins.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bypass scan path for use in an integrated circuit device internally having at least one control point and at least one observation point and for propagating corresponding control point and for propagating observation point data obtained at a corresponding observation point and externally outputting the same, said bypass scan path comprising:

single data input terminal for inputting selection data for selecting a data propagation path and said control point data in a serial manner, single data output terminal for serially outputting said observation point data, scan register means including a serial connection of at least one shift register latch each coupled to said control point and/or said observation point and coupled to said single data input terminal to form a register path for shifting and holding said control point data and said observation point data, a bypass path connected to said single data input terminal and enabling the data to bypass said scan register means, a selection data propagation holding register provided in said bypass path connected to said single data input terminal, said selection data propagation holding register shifting and holding said selection data input from said single data input terminal, and a selector having a first selection input coupled to said bypass path including said selection data propagation holding register and a second selection input coupled to said register path and configured to select either the register path formed by said scan register means or the bypass path including said selection data propagation holding register as a propagation path of said control point data and said observation point data and connect the selected path to said single data output terminal in response to the selection data held by said selection data propagation holding means, said bypass path together with said selection data propagation holding register being coupled between said data input terminal and said selection register, said selection data propagation holding register including
a selection data shift register provided in said bypass path configured to be operable in either selection data shifting state or a data through state wherein no shift operation is performed,
a selection data latch connected to an output of said selection data shift register, said selection data latch having an output connected to a control input of said selector.

2. The bypass scan path according to claim 1, wherein said selection data latch is reset in advance, thereby causing said selector to select said bypass path as a propagation path of said selection data.

3. The bypass scan path according to claim 2, wherein mode data, together with said selection data, is input from said data input terminal, said bypass further including:

mode data propagation holding register arranged on said bypass path in series with said selection data propagation holding register for shifting and holding said mode data, said mode data propagation holding register including:
a mode data shift register provided in said bypass path in series with said selection data shift register configured to be operable in either mode data and selection data shifting state or in the data through state,
a mode data latch connected to an output of said mode data shift register.

4. The bypass scan path according to claim 3, wherein each shift register latch in said scan register means is controlled to be operable in response to the mode data held by said mode data latch.

5. The bypass scan path according to claim 4, wherein each of said shift register means includes a first operation state wherein held control point data is output to said control points and a second operation state wherein observation point data applied from said observation points is captured and held, which operation states are selectively switched in response to the mode data held by said mode data latch.

6. The bypass scan path according to claim 5, wherein said selection data shift register and said mode data shift register perform a shifting operation in response to a shift clock signal and said selection data latch and said mode data latch hold selection data and mode data in response to a mode latch signal.

7. The bypass scan path according to claim 2, further comprising controlling means for controlling said selection data shift register to enter the data through state in response to said selection data latch holding selection data for selecting said bypass path.

8. The bypass scan path according to claim 1, wherein said selection data propagation holding means is provided in parallel to said register path and said bypass path and arranged on a selection data propagation path for propagating said selection data.

9. An integrated circuit device internally having a plurality of control points and a plurality of observation points, comprising:
   a single external data input terminal for serially inputting selection data for selecting a propagation path of data and control point data to be applied to said control points,
   a single external data output terminal for serially outputting observation point data obtained at said observation points, and
   at least one bypass scan path connected in series between said external data input terminal and said external data output terminal to form a serial propagation path for said selection data, said control point data and said observation point data,
   each of said bypass scan paths including:
      single internal data input terminal for serially inputting said selection data and said control point data,
      single internal data output terminal for serially outputting said observation point data,
      scan register means including a serial connection of at least one shift register latch each coupled to said control point and/or said observation point and coupled to said internal data input terminal to form a register path for shifting and holding said control point data and said observation point data,
      bypass means forming a bypass path of data for bypassing said scan register means,
      a selection data propagation holding register provided in said bypass path connected to said single internal data input terminal, said selection data propagation holding register shifting and holding said selection data input from said single internal data input terminal, and
      a selector having a first selection input coupled to said bypass path including said selection data propagation holding register and a second selection input coupled to said register path and configured to select either the register path formed by said scan register means or the bypass path including said selection data propagation holding register as a propagation path for said control point data and said observation point data and connect the selected path to said single internal data output terminal in response to the selection data held by said selection data propagation holding register,
      said selection data propagation holding register including
         a selection data shift register provided in said bypass path configured to be operable in either selection data shifting state or a data through state wherein no shift operation is performed, and
         a selection data latch connected to an output of said selection data shift register, said selection data latch having an output connected to a control input of said selector.

10. The integrated circuit device according to claim 9, further comprising a plurality of function modules each including a predetermined logic circuit, wherein said control points and said observation points are provided corresponding to said respective function modules.

11. The integrated circuit device according to claim 10, wherein said control point data is test data for said function modules, and said observation point data is test result data of said function modules.

12. The integrated circuit device according to claim 11, wherein said selector in each of said bypass scan path selects said register path for a function module to be tested and selects said bypass path for a function module not to be tested.

13. A bypass scan path for use in an integrated circuit device internally having at least one control point and at least one observation point and for propagating corresponding control point and for propagating observation point data obtained at a corresponding observation point and externally outputting the same, said bypass scan path comprising:
   single data input terminal for inputting selection data for selecting a data propagation path and said control point data in a serial manner,
   single data output terminal for serially outputting said observation point data,
   scan register means including a serial connection of at least one shift register latch each coupled to said single data input terminal to form a register path for shifting and holding said control point data and said observation point data,
   a bypass path connected to said single data input terminal and enabling the data to bypass said scan register means,
   a selection data propagation path arranged in parallel to said register path and said bypass path connected to said single data input terminal for propagating said selection data,
   a selection data propagation holding register provided in said selection data propagation path connected to said single data input terminal, said selection data propagation holding register shifting and holding said selection data input from said single data input terminal, and
   a selector having a first selection input coupled to said bypass path, a second selection input coupled to said selection data propagation path including said selection data propagation holding register and a third selection input coupled to said register path and configured to select either one of the register path formed by said scan register means, said bypass path, or said selection data propagation path including said selection data propagation holding register as a propagation path of said control point data and said observation point data and connect the selected path to said single data output terminal in response to the selection data held by said selection data propagation holding register,
   said selection data propagation holding register including
      a propagation shift register provided in said selection data propagation path configured to be operable either in selection data shifting state or in a data through state wherein no shift operation is performed, and
      a register latch connected to an output of said propagation shift register, said register latch has an output connected to a control input of said selector.

14. The bypass scan path according to claim 13, wherein said selector is reset in advance, thereby selecting said selection data propagation path as a propagation path of said selection data.

* * * * *